(12) United States Patent
Kawaminami

(10) Patent No.: US 10,418,315 B2
(45) Date of Patent: Sep. 17, 2019

(54) SEMICONDUCTOR DEVICE AND MANUFACTURING METHOD THEREOF

(71) Applicant: FUJITSU LIMITED, Kawasaki-shi, Kanagawa (JP)

(72) Inventor: Hironori Kawaminami, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/927,115

(22) Filed: Mar. 21, 2018

(65) Prior Publication Data
US 2018/0294215 A1 Oct. 11, 2018

(30) Foreign Application Priority Data

Apr. 11, 2017 (JP) ................... 2017-078338

(51) Int. Cl.
H01L 23/04 (2006.01)
H01L 23/498 (2006.01)
(Continued)

(52) U.S. Cl.
CPC ...... *H01L 23/49838* (2013.01); *H01L 23/481* (2013.01); *H01L 23/538* (2013.01);
(Continued)

(58) Field of Classification Search
CPC ............. H01L 23/59838; H01L 23/481; H01L 25/0657; H01L 25/50; H01L 2225/06517;
(Continued)

(56) References Cited

U.S. PATENT DOCUMENTS 9,153,557 B2 * 10/2015 Sung .................... H01L 25/0652
9,825,006 B2 * 11/2017 Miki .................... H01L 25/0657
(Continued)

FOREIGN PATENT DOCUMENTS

JP 2004-022610 1/2004
JP 2007-036104 2/2007
(Continued)

OTHER PUBLICATIONS

U.S. Office Action dated Jan. 30, 2019 for copending U.S. Appl. No. 15/927,122, 16 pages.
(Continued)

*Primary Examiner* — Hsien Ming Lee
(74) *Attorney, Agent, or Firm* — Fujitsu Patent Center

(57) ABSTRACT

A semiconductor device includes: a first semiconductor chip that includes through electrodes; a second semiconductor chip; and an interposer that has a recessed portion formed in a front surface thereof and includes a first wiring provided under a bottom surface of the recessed portion, in which the first semiconductor chip is fitted in the recessed portion with a chip top surface thereof flipped down to be electrically connected to the first wiring, the second semiconductor chip is connected on the front surface, of the interposer, around the recessed portion, and at the same time, is stacked on the first semiconductor chip in a manner to partially overlap the first semiconductor chip, and is electrically connected to the first semiconductor chip via the through electrodes.

18 Claims, 23 Drawing Sheets

(51) Int. Cl.
  *H01L 23/00* (2006.01)
  *H01L 25/00* (2006.01)
  *H01L 23/48* (2006.01)
  *H01L 25/065* (2006.01)
  *H01L 23/538* (2006.01)

(52) U.S. Cl.
  CPC .............. *H01L 24/17* (2013.01); *H01L 24/97* (2013.01); *H01L 25/0657* (2013.01); *H01L 25/50* (2013.01); H01L 24/16 (2013.01); H01L 24/81 (2013.01); H01L 2224/131 (2013.01); H01L 2224/16146 (2013.01); H01L 2224/16235 (2013.01); H01L 2224/16237 (2013.01); H01L 2224/171 (2013.01); H01L 2224/17181 (2013.01); H01L 2224/81191 (2013.01); H01L 2224/81986 (2013.01); H01L 2224/97 (2013.01); H01L 2225/06513 (2013.01); H01L 2225/06517 (2013.01); H01L 2225/06562 (2013.01); H01L 2924/15153 (2013.01)

(58) Field of Classification Search
  CPC . H01L 2225/06513; H01L 2225/06562; H01L 23/49838; H01L 23/535; H01L 23/49827
  See application file for complete search history.

(56) References Cited

U.S. PATENT DOCUMENTS

| | | |
|---|---|---|
| 2005/0007171 A1 | 1/2005 | Yoneda |
| 2007/0023887 A1 | 2/2007 | Matsui |
| 2008/0122501 A1 | 5/2008 | Narusawa et al. |
| 2010/0044846 A1 | 2/2010 | Ohmi et al. |

FOREIGN PATENT DOCUMENTS

| | | |
|---|---|---|
| JP | 2008-251666 | 10/2008 |
| JP | 2009-027068 | 2/2009 |
| JP | 2010-073771 | 4/2010 |

OTHER PUBLICATIONS

Notice of Allowance dated Jul. 19, 2019 for copending U.S. Appl. No. 15/927,122, 16 pages.

* cited by examiner

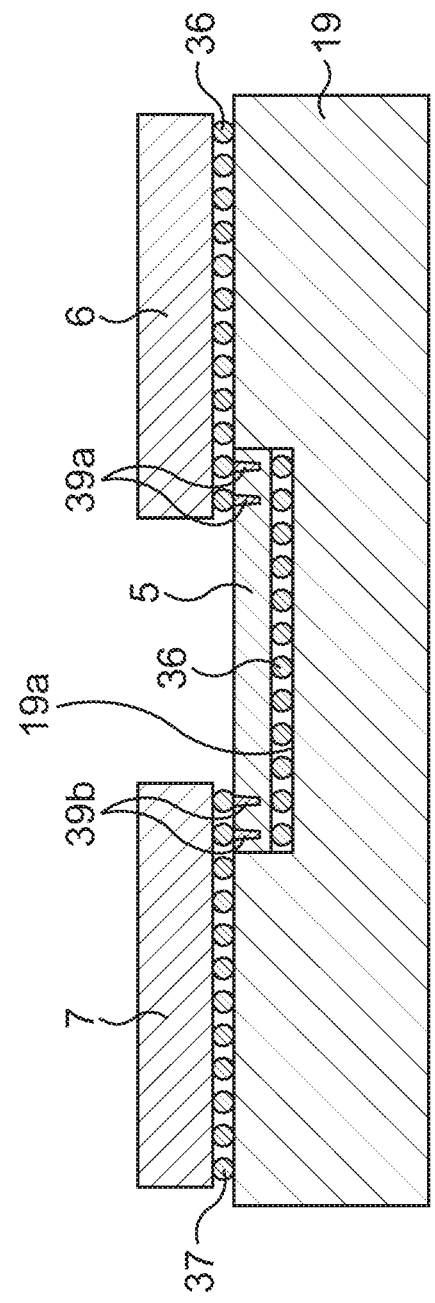

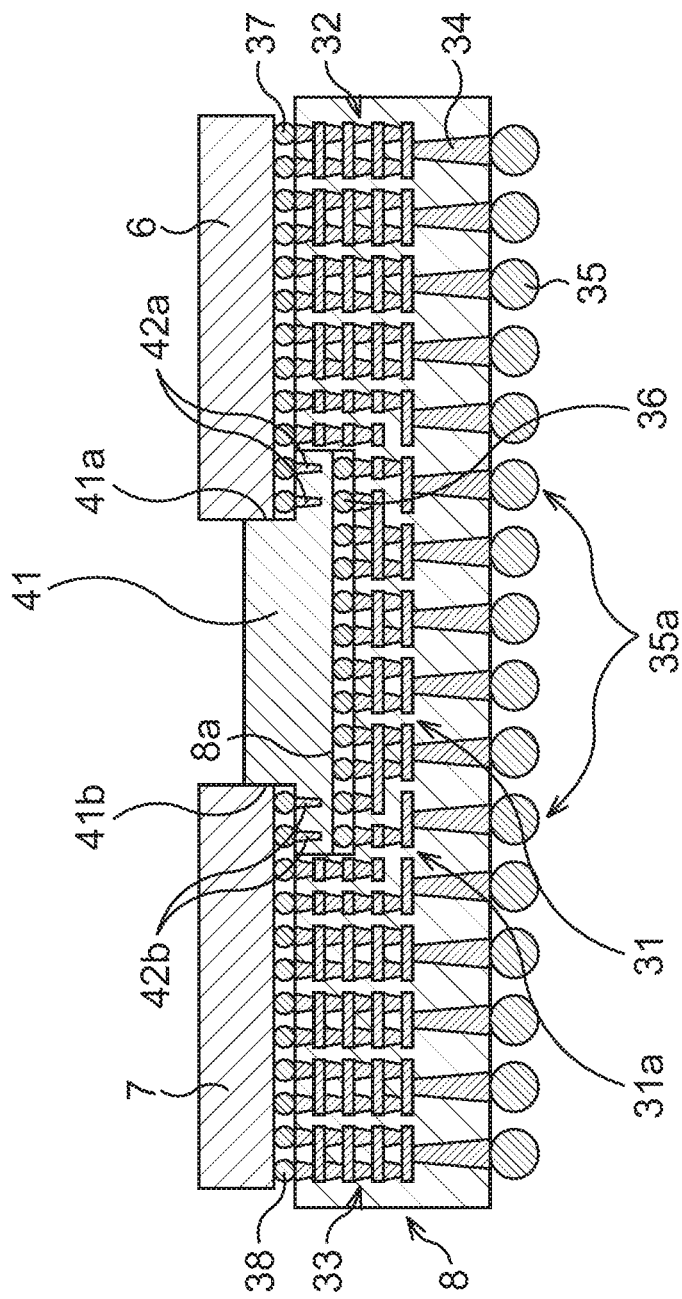

SEMICONDUCTOR DEVICE AND MANUFACTURING METHOD THEREOF

CROSS-REFERENCE TO RELATED APPLICATION

This application is based upon and claims the benefit of priority of the prior Japanese Patent Application No. 2017-078338, filed on Apr. 11, 2017, the entire contents of which are incorporated herein by reference.

FIELD

The embodiments discussed herein are directed to a semiconductor device and a manufacturing method thereof.

BACKGROUND

In recent years, it has been said in the semiconductor technical field that miniaturization (scaling) comes to have its limitations, and an improvement in performance not relying on miniaturization has been desired in the future. Examples of such a high-density packaging technology not relying on semiconductor miniaturization include a three-dimensional packaging technology in which a plurality of semiconductor chips are stacked on an interposer, for example. Further, a 2.5-dimensional packaging technology capable of manufacturing a semiconductor device more easily than the three-dimensional packaging technology has been drawing attention.

[Patent Document 1] Japanese Laid-open Patent Publication No. 2010-73771
[Patent Document 2] Japanese Laid-open Patent Publication No. 2004-22610
[Patent Document 3] Japanese Laid-open Patent Publication No. 2009-27068

In the 2.5-dimensional packaging technology, a plurality of semiconductor chips are arranged in parallel on an interposer, and the respective semiconductor chips are electrically connected via wirings in the interposer. In this case, the distance between the semiconductor chips becomes longer as compared to the three-dimensional packaging. Therefore, a latency between the semiconductor chips increases to cause a problem that the device performance decreases as compared to the three-dimensional packaging.

SUMMARY

According to one aspect, a semiconductor device includes: a connection structure that has a recessed portion formed in a front surface thereof; a first semiconductor chip that includes through electrodes in one end portion of a rear surface thereof, the through electrodes penetrating a semiconductor substrate, and is fitted in the recessed portion with a chip top surface thereof flipped down to be connected to the connection structure; and a second semiconductor chip that is connected on the one end portion of the first semiconductor chip and on the connection structure and is electrically connected to the first semiconductor chip via the through electrodes.

According to one aspect, a manufacturing method of a semiconductor device being a manufacturing method of a semiconductor device that includes: a connection structure that has a recessed portion formed in a front surface thereof; a first semiconductor chip that includes through electrodes in one end portion of a rear surface thereof, the through electrodes penetrating a semiconductor substrate; and a second semiconductor chip, the manufacturing method includes: fitting the first semiconductor chip in the recessed portion with a chip top surface thereof flipped down and connecting the first semiconductor chip to the connection structure, and connecting the second semiconductor chip on the one end portion of the first semiconductor chip and on the connection structure; and electrically connecting the first semiconductor chip and the second semiconductor chip via the through electrodes.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 12 is a schematic cross-sectional view illustrating another configuration of the semiconductor device according to the second embodiment;

FIG. 15 is a schematic cross-sectional view illustrating a configuration of a semiconductor device according to a modification example 1 of the second embodiment;

DESCRIPTION OF EMBODIMENTS

Hereinafter, there will be explained in detail various embodiments of a semiconductor device and a manufacturing method thereof with reference to the drawings.

First Embodiment

In this embodiment, there will be disclosed a semiconductor device and a manufacturing method thereof.

(Semiconductor Device Configuration)

Figure 1:
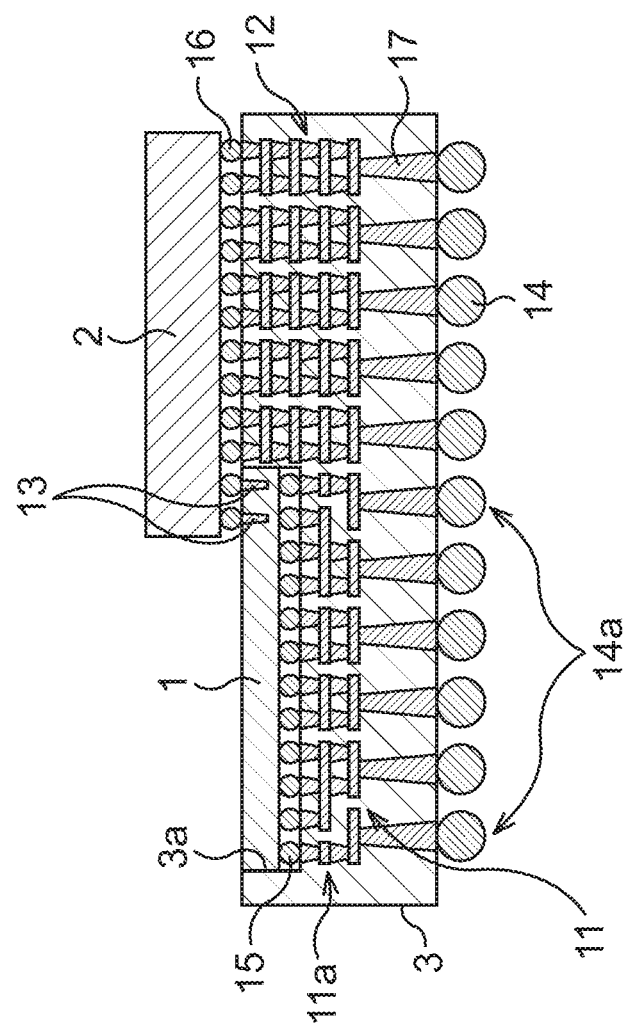
FIG. 1 is a schematic cross-sectional view illustrating a configuration of a semiconductor device according to a first embodiment.
Figure 2:
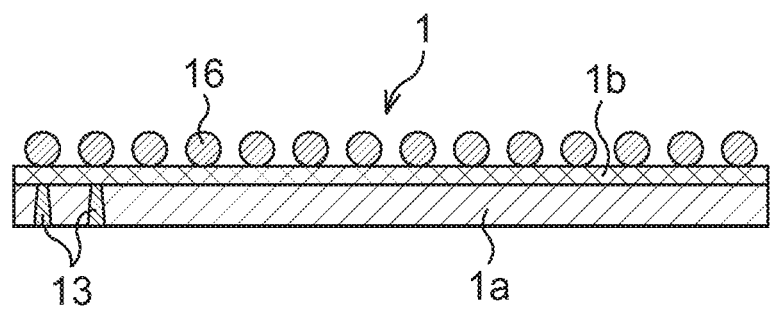
FIG. 2 is a schematic cross-sectional view illustrating a configuration of a first semiconductor chip of the semiconductor device according to the first embodiment.

FIG. 1 is a schematic cross-sectional view illustrating a configuration of a semiconductor device according to a first embodiment. FIG. 2 is a schematic cross-sectional view illustrating a configuration of a first semiconductor chip of the semiconductor device according to the first embodiment.

In this semiconductor device, a plurality of semiconductor chips, a first semiconductor chip 1 and a second semiconductor chip 2 here, are arranged in parallel on an interposer 3.

The interposer 3 has a recessed portion 3a formed in a front surface thereof, and has a signal wiring and a power supply wiring that are connected to the outside provided therein. For example, first wirings 11, 11a are provided under a bottom surface of the recessed portion 3a, and a second wiring 12 is provided under the front surface around the recessed portion 3a. The first wirings 11, 11a and the second wiring 12 have a wiring portion and a via portion connected to the wiring portion. In the rear surface side of the interposer 3, there are provided a plurality of through electrodes 13 being TSVs (Through Silicon Vias), for example, that penetrate a semiconductor substrate between a rear surface and the first wirings 11, 11a or the second wiring 12 and are each connected to the first wirings 11, 11a or the second wiring 12. On the rear surface of the interposer 3, bumps 14 being C4 bumps, for example, that are connected to through electrodes 17 respectively are provided. In the example of the drawing, two bumps 14a become an external signal connection portion.

The first semiconductor chip 1 has, as illustrated in FIG. 2, an element forming region 1b where various functional elements such as MOS transistors, their wirings, and so on, for example, are provided formed on a semiconductor substrate 1a, and has bumps 15 being p bumps, for example, provided on a front surface thereof. The first semiconductor chip 1 has through electrodes 13 being TSVs, for example, that penetrate the semiconductor substrate 1a provided in one end portion of a rear surface thereof (a portion on which the later-described second semiconductor chip 2 is stacked). The through electrodes 13 are connected to the wirings and so on of the element forming region 1b. As for the through electrodes 13, two types of a through electrode for power supply and a through electrode for signal transmission exist.

The second semiconductor chip 2 has, similarly to the first semiconductor chip 1, an element forming region where various functional elements such as MOS transistors, their wirings, and so on, for example, are provided formed on a semiconductor substrate, and has bumps 16 being p bumps, for example, provided on a front surface thereof (a rear surface thereof in FIG. 1).

The first semiconductor chip 1 and the second semiconductor chip 2 are connected face down to the interposer 3. Here, "face down" means to mount a chip with its top surface having an electrode provided thereon flipped down. Concretely, the first semiconductor chip 1 is fitted in the recessed portion 3a of the interposer 3 with its chip top surface flipped down, and the bumps 15 and the first wirings 11, 11a of the interposer 3 are electrically connected. The second semiconductor chip 2 is arranged on the front surface, of the interposer 3, around the recessed portion 3a so as to be stacked on the rear surface of the first semiconductor chip 1 in a partially overlapping manner in a plan view. At the overlapping portion, the bumps 16 of the second semiconductor chip 2 and the through electrodes 13 of the first semiconductor chip 1 are directly connected. On the front surface, of the interposer 3, around the recessed portion 3a, the bumps 16 of the second semiconductor chip 2 and the second wiring 12 of the interposer 3 are electrically connected.

In the semiconductor device according to this embodiment, the semiconductor chips connected on the interposer are not separated from each other like a conventional semiconductor device with the 2.5-dimensional packaging technology applied thereto, and the first semiconductor chip 1 and the second semiconductor chip 2 are stacked and connected in a manner to overlap partially. At the overlapping portion, the first semiconductor chip 1 and the second semiconductor chip 2 are directly electrically connected by the through electrodes 13, and signal communication between the semiconductor chips is performed. In this embodiment, even with the application of the 2.5-dimensional packaging technology, the first semiconductor chip 1 and the second semiconductor chip 2 are directly connected at the overlapping portion, and thus the distance between the semiconductor chips is drastically reduced as compared to the conventional semiconductor device. Thereby, the latency between the semiconductor chips is reduced and high device performance is achieved.

In this embodiment, thanks to the reduction in distance between the semiconductor chips, an enormous IO cell having large drive capability, which is needed because of the distance between the semiconductor chips being long, is not needed and high-density packaging is enabled. Further, due to the 2.5-dimensional packaging, more sufficient power supply and higher heat exhaust efficiency than the three-dimensional packaging can be achieved, and higher-density packaging than the current SoC (System on Chip), for example, can be performed. Conventionally, all the connection wirings between respective semiconductor chips go through the inside of an interposer, and thus there is a possibility that the wirings inside the interposer are congested to make designing of the interposer difficult. In this embodiment, on the other hand, signal communication is performed in the overlapping portion of the first semiconductor chip 1 and the second semiconductor chip 2, so that the wirings inside the interposer are simplified, the designing is facilitated, and further the manufacturing cost is reduced.

In this embodiment, power is supplied to the first semiconductor chip 1 and the second semiconductor chip 2 via the interposer 3, and in the overlapping portion of the first semiconductor chip 1 and the second semiconductor chip 2, power supply is performed via the through electrodes 13. Therefore, there is no concern about the shortage of power supply. Further, an interface circuit between the semiconductor chips is only arranged at the overlapping portion, thereby making it possible to reduce power consumption as much as possible.

Figure 3:
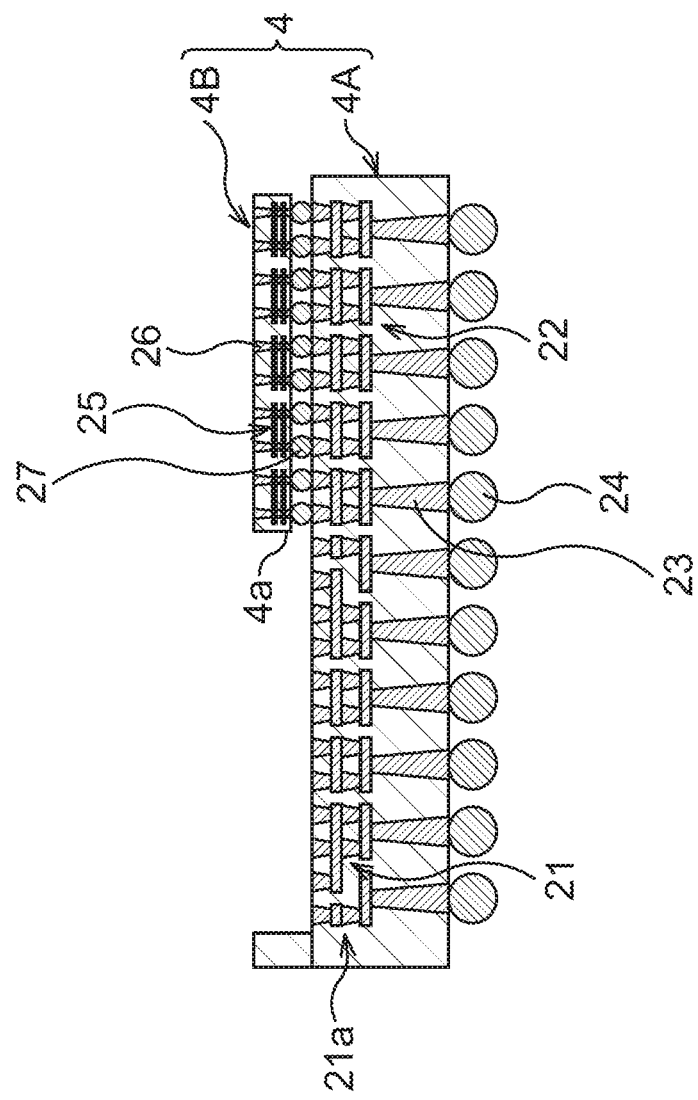
FIG. 3 is a schematic cross-sectional view illustrating another interposer in the semiconductor device according to the first embodiment.

In this embodiment, in place of the interposer 3, such an interposer 4 as illustrated in FIG. 3 may be used.

The interposer 4 includes a first interposer 4A having a flat upper surface, and a second interposer 4B having an opening portion 4a formed therein. The second interposer 4B is connected on the first interposer 4A, and the opening portion 4a is the above-described recessed portion.

In the first interposer 4A, first wirings 21, 21a are provided under a bottom surface of the opening portion 4a, and a second wiring 22 is provided under a front surface around the opening portion 4a. The first wirings 21, 21a and the second wiring 22 have a wiring portion and a via portion connected to the wiring portion. In the rear surface side of the interposer 4, there are provided a plurality of through electrodes 23 being TSVs, for example, that penetrate a semiconductor substrate between a rear surface and the first wirings 21, 21a or the second wiring 22 and are each connected to the first wirings 21, 21a or the second wiring 22. On the rear surface of the interposer 4, bumps 24 being C4 bumps, for example, that are connected to the through electrodes 23 respectively are provided.

In the second interposer 4B, a third wiring 25 is provided in the inside, and in the front surface side, there are provided a plurality of through electrodes 26 being TSVs, for example, that penetrate a semiconductor substrate between a front surface and the third wiring 25 and are connected to the third wiring 25. On a rear surface of the second interposer 4B, bumps 27 being p bumps, for example, that are connected to the through electrodes 23 respectively are provided.

The bumps 26 on the second interposer 4B and the first wirings 21, 21a or the second wiring 22 in the first interposer 4A are electrically connected.

Figure 4:
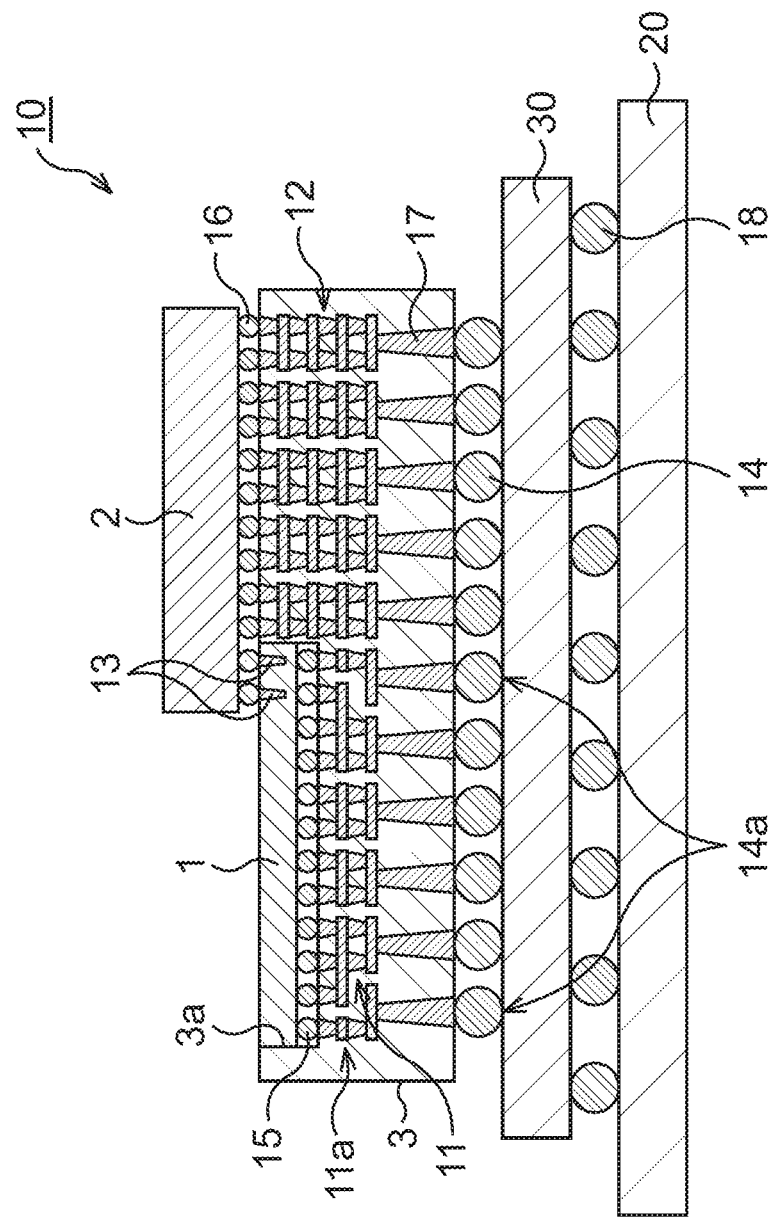
FIG. 4 is a schematic cross-sectional view illustrating a stacked semiconductor structure using the semiconductor device according to this embodiment.

As illustrated in FIG. 4, a semiconductor device 10 according to this embodiment is mounted on a package 30 bonded onto a substrate 20 with solder balls 18 to make a stacked semiconductor structure. The semiconductor device 10 is electrically connected on the package 30 by the bumps 14.

(Manufacturing Method of the Semiconductor Device)

Next, there will be explained manufacturing methods of the semiconductor device according to this embodiment.

—Manufacturing Method 1—

Figure 5:
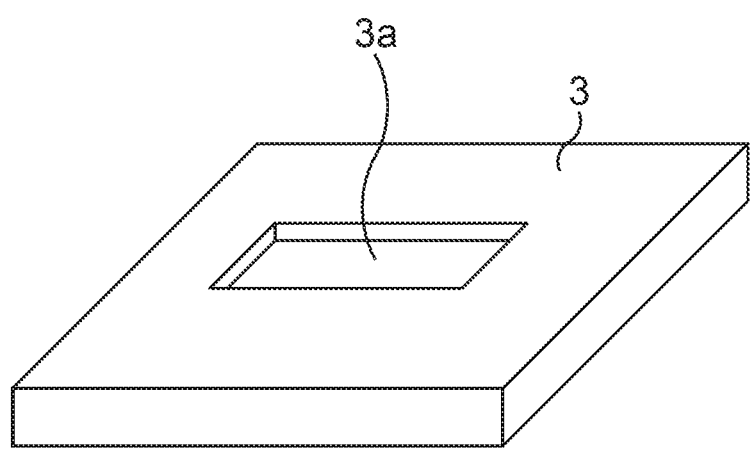
FIG. 5 is a schematic perspective view illustrating an interposer used in the first embodiment.
Figure 6A:
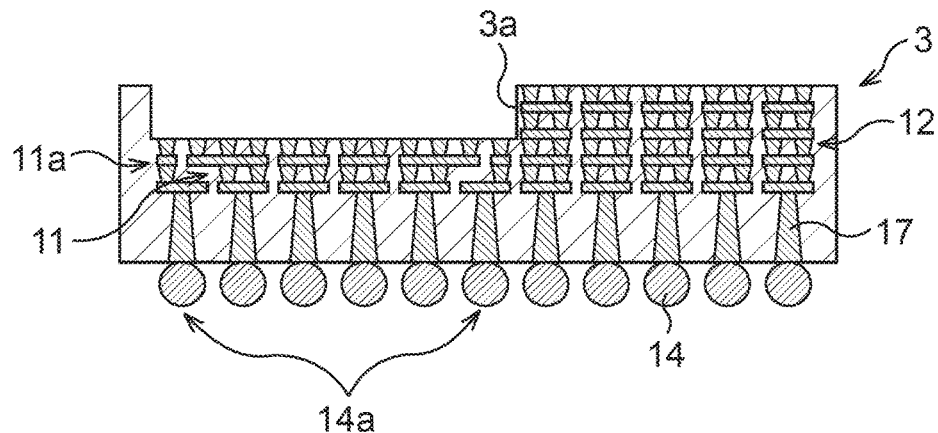
FIG. 6A to FIG. 6C are schematic cross-sectional views illustrating a manufacturing method 1 of the semiconductor device according to the first embodiment in order of processes.
Figure 6B:
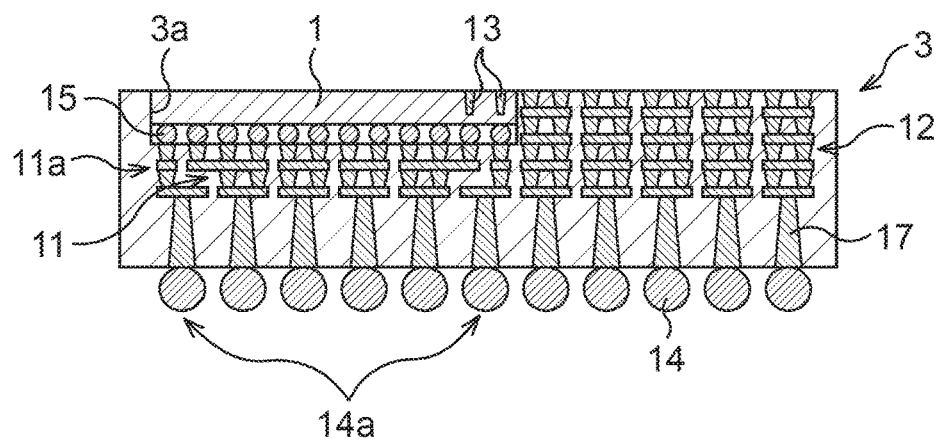
Figure 6C:
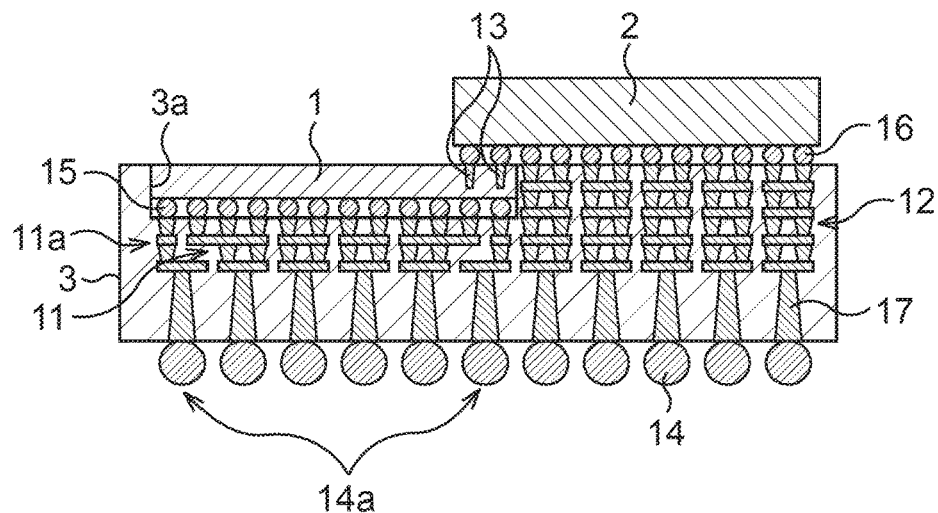

FIG. 5 is a schematic perspective view illustrating the interposer to be used for the first embodiment. FIG. 6A to FIG. 6C are schematic cross-sectional views illustrating a manufacturing method 1 of the semiconductor device according to the first embodiment in order of processes.

First, as illustrated in FIG. 5 and FIG. 6A, the interposer 3 is prepared. The interposer 3 has the recessed portion 3a formed in the front surface thereof, and in the inside thereof, as the power supply wiring, the first wiring 11 and the second wiring 12 are provided, and as the signal wiring, the first wiring 11a is provided.

Subsequently, as illustrated in FIG. 6B, the first semiconductor chip 1 is connected face down to the interposer 3.

More specifically, the first semiconductor chip 1 is fitted in the recessed portion 3a of the interposer 3 with the chip top surface flipped down, and the bumps 15 of the first semiconductor chip 1 are electrically connected to the first wirings 11, 11a of the interposer 3.

Subsequently, as illustrated in FIG. 6C, the second semiconductor chip 2 is connected face down to the interposer 3.

More specifically, the second semiconductor chip 2 is arranged on the front surface, of the interposer 3, around the recessed portion 3a and at the same time, is stacked on the first semiconductor chip 1 at the overlapping portion. Then, the bumps 16 of the second semiconductor chip 2 are electrically connected to the second wiring 12 of the interposer 3, and the bumps 16 of the second semiconductor chip 2 and the through electrodes 13 of the first semiconductor chip 1 are electrically connected.

As above, the semiconductor device according to this embodiment is formed.

—Manufacturing Method 2—

Figure 7A:
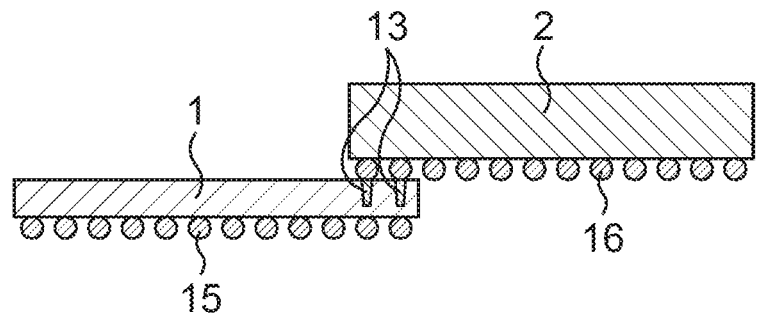
FIG. 7A and FIG. 7B are schematic cross-sectional views illustrating a manufacturing method 2 of the semiconductor device according to the first embodiment in order of processes.
Figure 7B:
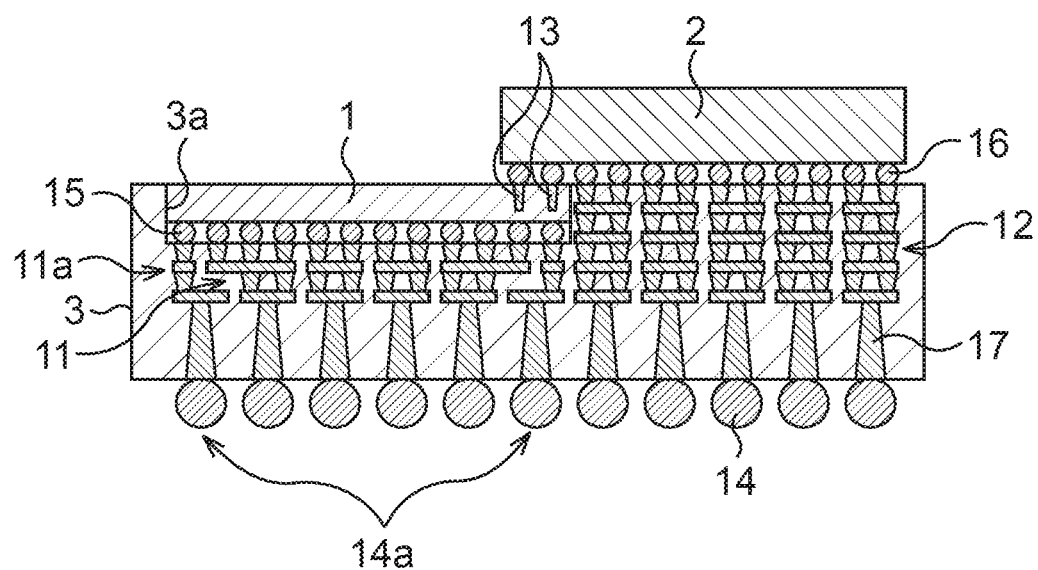

FIG. 7A and FIG. 7B are schematic cross-sectional views illustrating a manufacturing method 2 of the semiconductor device according to the first embodiment in order of processes.

First, similarly to the manufacturing method 1, the interposer 3 is prepared.

Subsequently, as illustrated in FIG. 7A, the first semiconductor chip 1 and the second semiconductor chip 2 are connected.

More specifically, the second semiconductor chip 2 is stacked on the first semiconductor chip 1 at the overlapping portion, and the bumps 16 of the second semiconductor chip 2 and the through electrodes 13 of the first semiconductor chip 1 are electrically connected.

Subsequently, as illustrated in FIG. 7B, the first semiconductor chip 1 and the second semiconductor chip 2 connected at the overlapping portion are connected face down to the interposer 3.

More specifically, the first semiconductor chip 1 is fitted in the recessed portion 3a of the interposer 3 with the chip top surface flipped down, and at the same time, the second semiconductor chip 2 is arranged on the front surface, of the interposer 3, around the recessed portion 3a. Then, the bumps 15 of the first semiconductor chip 1 are electrically connected to the first wirings 11, 11a of the interposer 3, and the bumps 16 of the second semiconductor chip 2 are electrically connected to the second wiring 12 of the interposer 3.

As above, the semiconductor device according to this embodiment is formed.

Second Embodiment

In this embodiment, there will be disclosed a semiconductor device and a manufacturing method thereof similarly to the first embodiment, but this embodiment is different from the first embodiment in that the stacked state of the semiconductor chips is different.

(Semiconductor Device Configuration)

Figure 8:
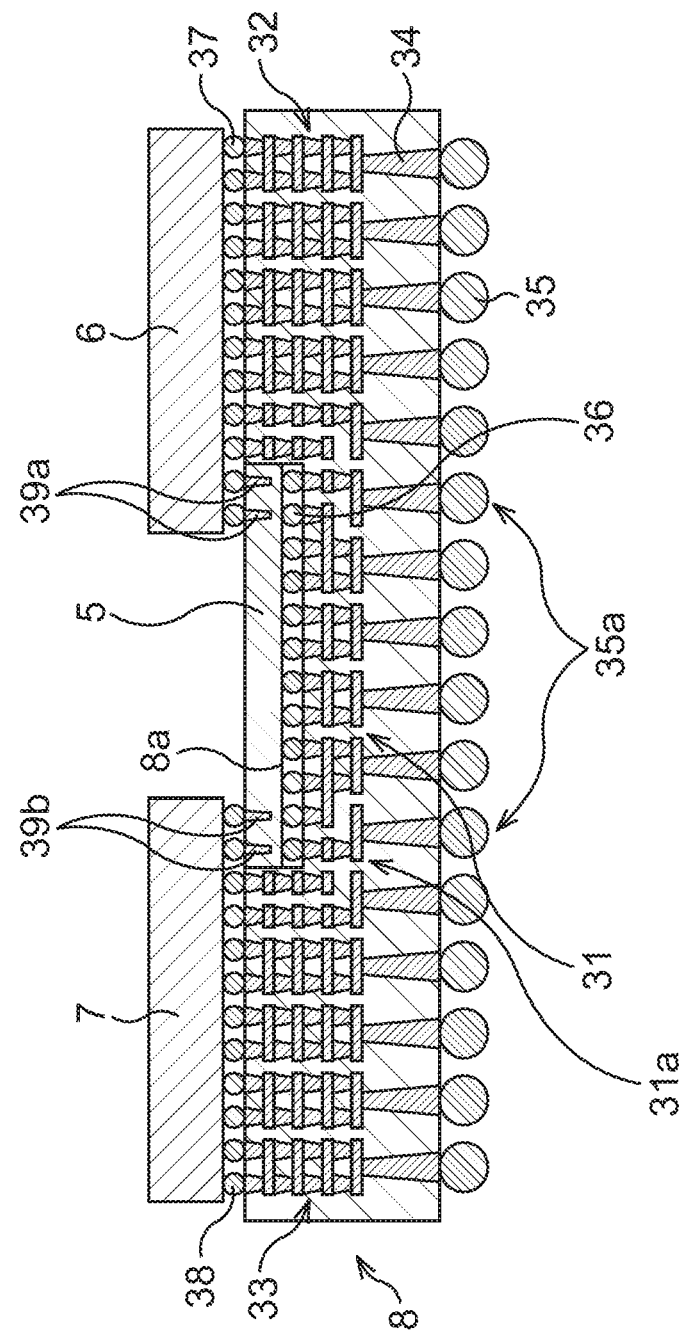
FIG. 8 is a schematic cross-sectional view illustrating a configuration of a semiconductor device according to a second embodiment.
Figure 9:
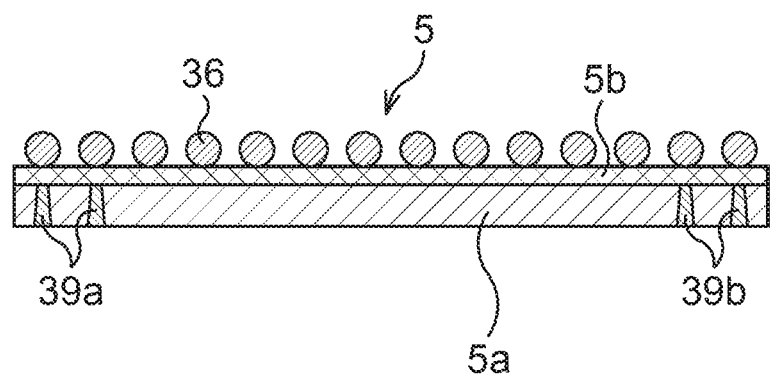
FIG. 9 is a schematic cross-sectional view illustrating a configuration of a first semiconductor chip of the semiconductor device according to the second embodiment.

FIG. 8 is a schematic cross-sectional view illustrating a configuration of a semiconductor device according to a second embodiment. FIG. 9 is a schematic cross-sectional view illustrating a configuration of a first semiconductor chip in the semiconductor device according to the second embodiment.

In this semiconductor device, a plurality of semiconductor chips, a first semiconductor chip 5, a second semiconductor chip 6, and a third semiconductor chip 7 here, are arranged in parallel on an interposer 8.

The interposer 8 has a recessed portion 8a formed in a front surface thereof, and has a signal wiring and a power supply wiring that are connected to the outside provided therein. For example, first wirings 31, 31a are provided under a bottom surface of the recessed portion 8a, and a second wiring 32 and a third wiring 33 are provided under the front surface around the recessed portion 8a. The first, second, and third wirings 31, 31a, 32, and 33 have a wiring portion and a via portion connected to the wiring portion. In the rear surface side of the interposer 8, there are provided a plurality of through electrodes 34 being TSVs, for example, that penetrate a semiconductor substrate between a rear surface and the first wirings 31, 31a, the second wiring 32, or the third wiring 33 and are each connected to the first wirings 11, 11a, the second wiring 32, or the third wiring 33. On the rear surface of the interposer 8, bumps 35 being C4 bumps, for example, that are connected to the through electrodes 34 respectively are provided. In the example of the drawing, two bumps 35a become an external signal connection portion.

The first semiconductor chip 5 has, as illustrated in FIG. 9, an element forming region 5b where various functional elements such as MOS transistors, their wirings, and so on, for example, are provided formed on a semiconductor substrate 5a, and has bumps 36 being p bumps, for example, provided on a front surface thereof. The first semiconductor chip 1 has through electrodes 39a being TSVs, for example, that penetrate the semiconductor substrate 5a provided in one end portion of a rear surface thereof (a portion overlapping the later-described second semiconductor chip 6). The first semiconductor chip 1 has through electrodes 39b being TSVs, for example, that penetrate the semiconductor substrate 5a provided in the other end portion of the rear surface thereof (a portion overlapping the later-described third semiconductor chip 7). The through electrodes 39a, 39b are connected to the wirings and so on of the element forming region 5b. As for the through electrodes 39a, 39b, two types of a through electrode for power supply and a through electrode for signal transmission exist.

The second and third semiconductor chips 6, 7 each have, similarly to the first semiconductor chip 1, an element forming region where various functional elements such as MOS transistors, their wirings, and so on, for example, are provided formed on a semiconductor substrate, and have bumps 37, 38 being bumps, for example, provided on a front surface thereof (a rear surface thereof in FIG. 8) respectively.

The first, second, and third semiconductor chips 5, 6, and 7 are connected face down to the interposer 8. Concretely, the first semiconductor chip 5 is fitted in the recessed portion 8a of the interposer 8 with its chip top surface flipped down, and the bumps 36 and the first wirings 31, 31a of the interposer 8 are electrically connected. The second semiconductor chip 6 is arranged on the front surface, of the interposer 8, around the recessed portion 8a so as to be partially stacked on the rear surface of the first semiconductor chip 5 in a plan view. At the overlapping portion, the bumps 37 of the second semiconductor chip 6 and the through electrodes 39a of the first semiconductor chip 6 are directly connected. On the front surface, of the interposer 8, around the recessed portion 8a, the bumps 37 of the second semiconductor chip 6 and the second wiring 32 of the interposer 8 are electrically connected. The third semiconductor chip 7 is arranged on the front surface, of the interposer 8, around the recessed portion 8a so as to partially overlap the rear surface of the first semiconductor chip 5 in a plan view. At the overlapping portion, the bumps 38 of the third semiconductor chip 7 and the through electrodes 39b of the first semiconductor chip 5 are directly connected. On the front surface, of the interposer 8, around the recessed portion 8a, the bumps 38 of the third semiconductor chip 7 and the third wiring 33 of the interposer 8 are electrically connected.

In the semiconductor device according to this embodiment, the semiconductor chips connected on the interposer are not separated from each other like a conventional semiconductor device with the 2.5-dimensional packaging technology applied thereto, and the first semiconductor chip 5 and the second semiconductor chip 6, and the first semiconductor chip 5 and the third semiconductor chip 7 are each stacked and connected in a manner to overlap partially. In the overlapping portions, the first semiconductor chip 5 and the second semiconductor chip 6 are directly electrically connected by the through electrodes 39a, and the first semiconductor chip 5 and the third semiconductor chip 7 are directly electrically connected by the through electrodes 39b. Thereby, signal communication between the first semiconductor chip 5 and the second semiconductor chip 6 and signal communication between the first semiconductor chip 5 and the third semiconductor chip 7 are performed. In this embodiment, the 2.5-dimensional packaging technology is applied, but the first semiconductor chip 5 and the second semiconductor chip 6, and the first semiconductor chip 5 and the third semiconductor chip 7 are directly connected in the overlapping portions, and thus the distance between the semiconductor chips is drastically reduced as compared to the conventional semiconductor device. Thereby, the latency between the semiconductor chips is reduced and high device performance is achieved.

In this embodiment, thanks to the reduction in distance between the semiconductor chips, an enormous IO cell having large drive capability, which is needed because of the distance between the semiconductor chips being long, is not needed and high-density packaging is enabled. Further, due to the 2.5-dimensional packaging, more sufficient power supply and higher heat exhaust efficiency than the three-dimensional packaging can be achieved, and higher-density packaging than the current SoC (System on Chip), for example, can be performed. Conventionally, all the connection wirings between respective semiconductor chips go through the inside of an interposer, and thus there is a possibility that the wirings inside the interposer are congested to make designing of the interposer difficult. In this embodiment, on the other hand, signal communication is performed in the overlapping portion of the first semiconductor chip 5 and the second semiconductor chip 6 and in the overlapping portion of the first semiconductor chip 5 and the third semiconductor chip 7, so that the wirings inside the interposer 8 are simplified, the designing is facilitated, and further the manufacturing cost is reduced.

Figure 10:
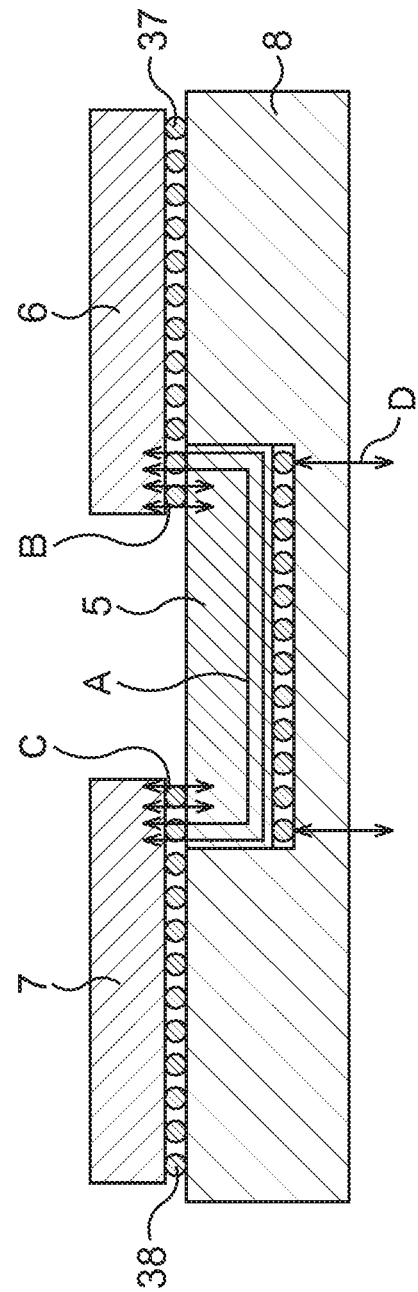
FIG. 10 is a schematic cross-sectional view illustrating another configuration of the semiconductor device according to the second embodiment.

In this embodiment, in place of applying the configuration in which the second semiconductor chip 6 and the third semiconductor chip 7 are electrically connected via the first, second, and third wirings 31, 31*a*, 32, and 33, as illustrated in FIG. 10, a wiring for signal connection may be provided in the first semiconductor chip 5. In FIG. 10, connection paths by the wiring for signal connection are indicated by the arrow A, connection paths of the first semiconductor chip 5 and the second semiconductor chip 6 are indicated by the arrow B, connection paths of the first semiconductor chip 5 and the third semiconductor chip 7 are indicated by the arrow C, and connection paths by the first wirings under the recessed portion 8*a* are indicated by the arrow D. Incidentally, in FIG. 10, the first semiconductor chip 5 is drawn thickly for convenience of adding the arrow A.

In this case, the second semiconductor chip 6 and the third semiconductor chip 7 are electrically connected by not the wirings inside the interposer 8, but the wirings for connection inside the first semiconductor chip 5. Application of this configuration makes it possible to simplify the wiring configuration of the interposer 8, and at the same time, reduce a packaging region of the IO cell, resulting in that higher-density packaging of semiconductor chips is enabled.

Figure 11:
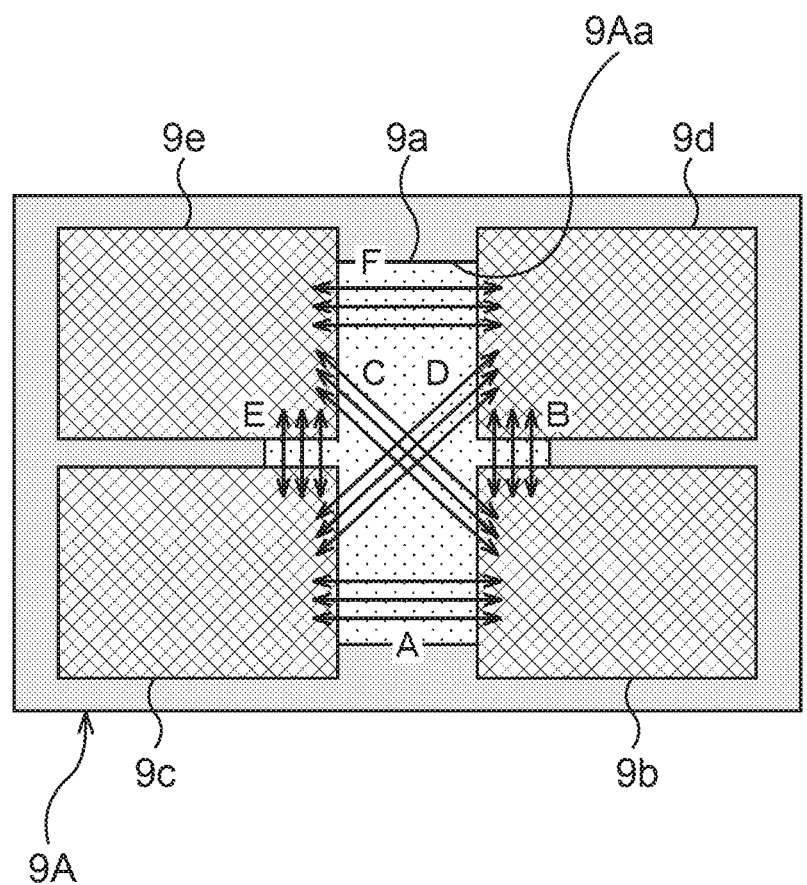
FIG. 11 is a schematic cross-sectional view illustrating another configuration of the semiconductor device according to the second embodiment.

As the configuration in which the wirings for connection are provided in the first semiconductor chip, a semiconductor device formed by arranging more semiconductor chips on an interposer is illustrated in FIG. 11 as an example.

In this semiconductor device, a first semiconductor chip 9*a* is fitted in a recessed portion 9A*a* of an interposer 9A to be connected to the interposer 9A, and second, third, fourth, and fifth semiconductor chips 9*b*, 9*c*, 9*d*, and 9*e* are connected to four overlapping portions around the recessed portion 9A*a* of the interposer 8 by through electrodes inside the first semiconductor chip 9*a* respectively. In the first semiconductor chip 9*a*, wirings for signal connection that each electrically connect the two first semiconductor chips are provided. That is, wirings for signal connection A (indicated by the arrow A) connect the second semiconductor chip 9*b* and the third semiconductor chip 9*c*. Wirings for signal connection B (indicated by the arrow B) connect the second semiconductor chip 9*b* and the fourth semiconductor chip 9*d*. Wirings for signal connection C (indicated by the arrow C) connect the second semiconductor chip 9*b* and the fifth semiconductor chip 9*e*. Wirings for signal connection D (indicated by the arrow D) connect the third semiconductor chip 9*c* and the fourth semiconductor chip 9*d*. Wirings for signal connection E (indicated by the arrow E) connect the third semiconductor chip 9*c* and the fifth semiconductor chip 9*e*. Wirings for signal connection F (indicated by the arrow F) connect the fourth semiconductor chip 9*d* and the fifth semiconductor chip 9*e*.

In this manner, a wiring structure for signal connection is provided inside the first semiconductor chip 9*a*, thereby making it possible to electrically connect each two of the plural semiconductor chips connected on the interposer 9A with the shortest path, resulting in that it becomes possible to reduce the packaging region of the IO cell to achieve higher-density packaging of semiconductor chips.

In this embodiment, power is supplied to the first, second, and third chips 5, 6, and 7 via the interposer 8 as illustrated in FIG. 8, and in the overlapping portion of the first semiconductor chip 5 and the second semiconductor chip 6 and the overlapping portion of the first semiconductor chip 5 and the third semiconductor chip 7, power supply is performed via the through electrodes 39*a*, 39*b* respectively. Therefore, there is no concern about the shortage of power supply. Further, an interface circuit between the semiconductor chips is only arranged at each of the overlapping portions, thereby making it also possible to reduce the power consumption as much as possible.

Incidentally, the semiconductor device according to this embodiment is also mounted on a package bonded onto a substrate to make a stacked semiconductor structure, similarly to the semiconductor device according to the first embodiment.

Further, in the case where the wirings for connection are provided in the first semiconductor chip 5 as described above, as illustrated in FIG. 12, a package 19 may be used in place of the interposer 8. In this case, the package 19 has a recessed portion 19*a* formed in a front surface thereof and has a signal wiring (not illustrated) that is connected to the outside provided therein. Similarly to the case of using the interposer 8, the first semiconductor chip 5 is fitted in the recessed portion 19*a* of the package 19 to be connected to the package 19. The second and third semiconductor chips 6, 7 are connected to overlapping portions with the first semiconductor chip 5 by using the through electrodes 39*a*, 39*b* respectively, and at the same time, are connected to the front surface, of the package 19, around the recessed portion 19*a*.

—Manufacturing Method 1—

Figure 13A:
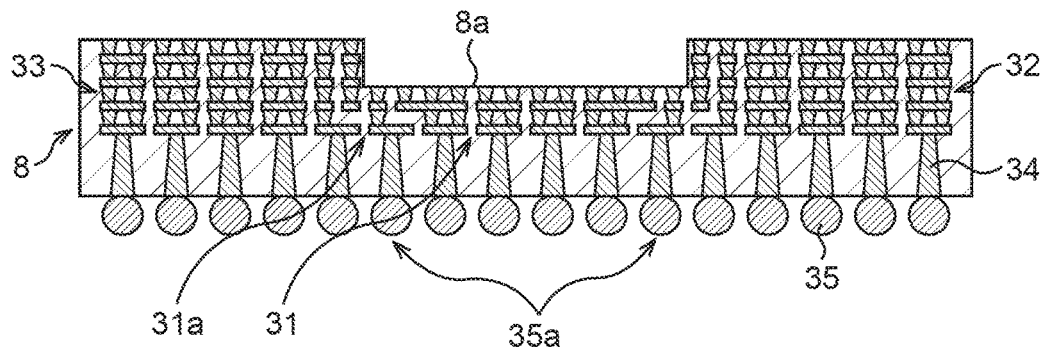
FIG. 13A to FIG. 13C are schematic cross-sectional views illustrating a manufacturing method 1 of the semiconductor device according to the second embodiment in order of processes.
Figure 13B:
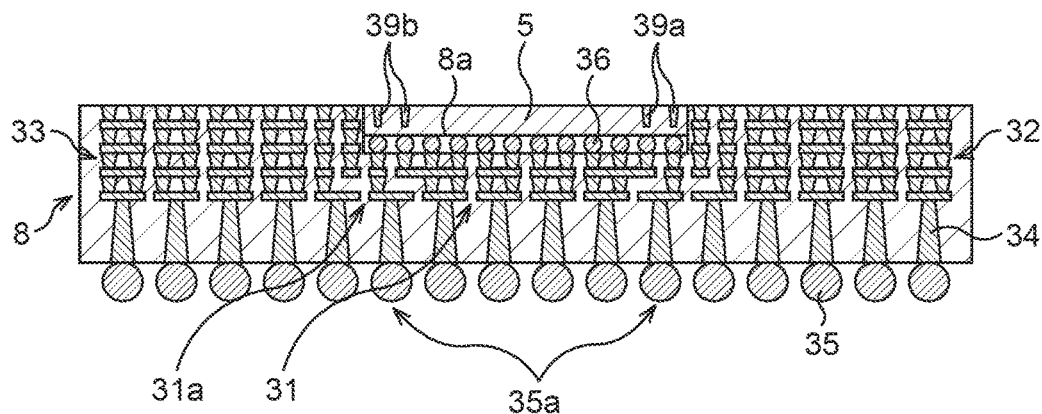
Figure 13C:
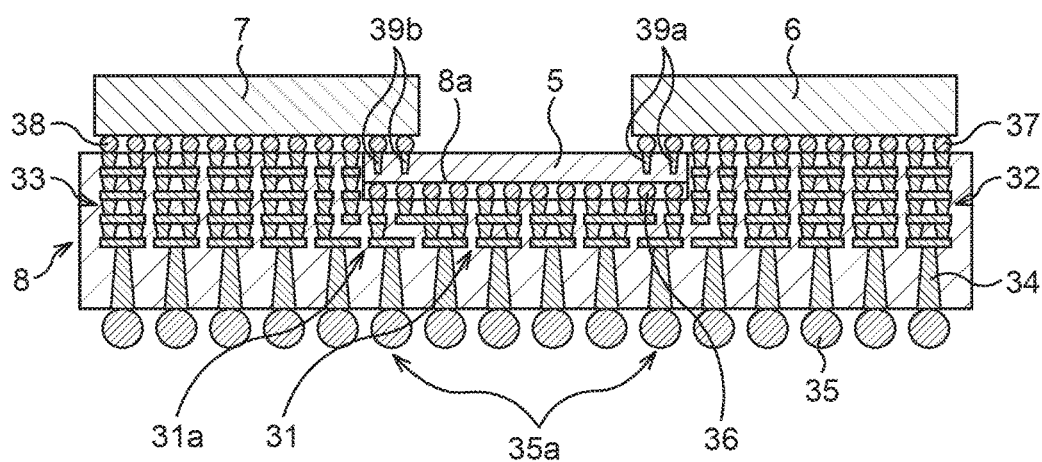

FIG. 13A to FIG. 13C are schematic cross-sectional views illustrating a manufacturing method 1 of the semiconductor device according to the second embodiment in order of processes.

First, as illustrated in FIG. 13A, the interposer 8 is prepared. The interposer 8 has the recessed portion 8*a* formed in the front surface thereof, and has the first, second, and third wirings 31, 32, and 33 provided therein as the power supply wiring.

Subsequently, as illustrated in FIG. 13B, the first semiconductor chip 5 is connected face down to the interposer 8.

More specifically, the first semiconductor chip 5 is fitted in the recessed portion 8*a* of the interposer 8 with the chip top surface flipped down, and the bumps 36 of the first semiconductor chip 5 are electrically connected to the first wirings 31, 31*a* of the interposer 8.

Subsequently, as illustrated in FIG. 13C, the second and third semiconductor chips 6, 7 are connected face down to the interposer 8.

More specifically, the second semiconductor chip 6 is provided on the front surface, of the interposer 8, around the recessed portion 8*a* and at the same time, is stacked on the first semiconductor chip 5 at the overlapping portion. The third semiconductor chip 7 is provided on the front surface, of the interposer 8, around the recessed portion 8*a* and at the same time, is stacked on the first semiconductor chip 5 at the overlapping portion. Then, the bumps 37 of the second semiconductor chip 6 are electrically connected to the second wiring 32 of the interposer 8, and the bumps 37 of the second semiconductor chip 6 and the through electrodes 39*a* of the first semiconductor chip 5 are electrically connected. Similarly, the bumps 38 of the third semiconductor chip 7 are electrically connected to the third wiring 33 of the interposer 8, and at the same time, the bumps 38 of the third semiconductor chip 7 and the through electrodes 39*b* of the first semiconductor chip 5 are electrically connected.

As above, the semiconductor device according to this embodiment is formed.

—Manufacturing Method 2—

Figure 14A:
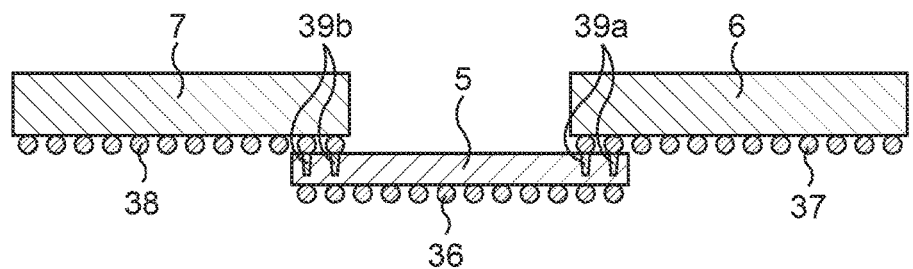
FIG. 14A and FIG. 14B are schematic cross-sectional views illustrating a manufacturing method 2 of the semiconductor device according to the second embodiment in order of processes.
Figure 14B:
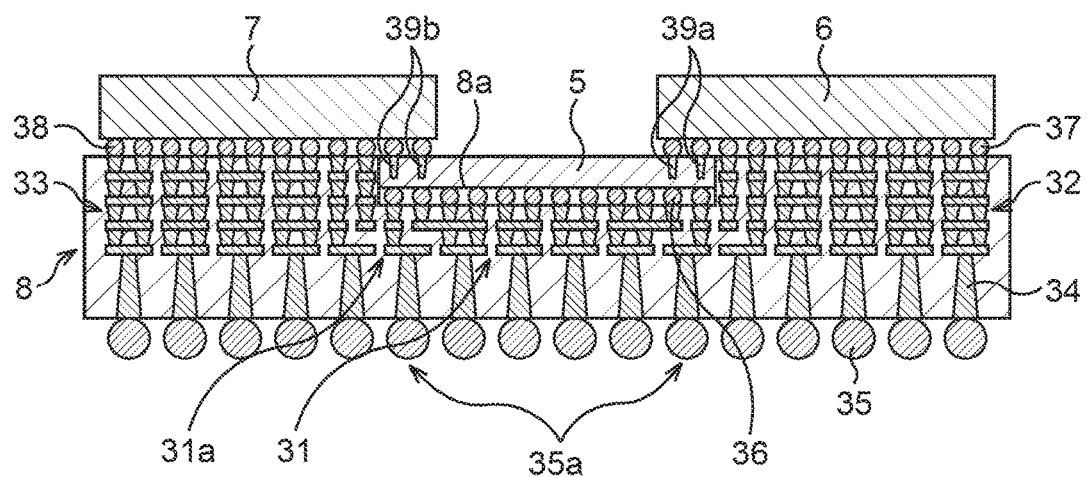

FIG. 14A and FIG. 14B are schematic cross-sectional views illustrating a manufacturing method 2 of the semiconductor device according to the second embodiment in order of processes.

First, similarly to the manufacturing method 1, the interposer 8 is prepared.

Subsequently, as illustrated in FIG. 14A, the first semiconductor chip 5 and the second and third semiconductor chips 6, 7 are connected.

More specifically, the second semiconductor chip 6 is stacked on the first semiconductor chip 5 at the overlapping portion, and the bumps 37 of the second semiconductor chip 6 and the through electrodes 39*a* of the first semiconductor chip 5 are electrically connected. Similarly, the third semiconductor chip 7 is stacked on the first semiconductor chip 5 at the overlapping portion, and the bumps 38 of the third semiconductor chip 7 and the through electrodes 39*b* of the first semiconductor chip 6 are electrically connected.

Subsequently, as illustrated in FIG. 14B, the first, second, and third semiconductor chips 5, 6, and 7 connected at the overlapping portions are connected face down to the interposer 8.

More specifically, the first semiconductor chip 5 is fitted in the recessed portion 8*a* of the interposer 8 with the chip top surface flipped down, and the second and third semiconductor chips 6, 7 are provided on the front surface, of the interposer 8, around the recessed portion 8*a*. Then, the bumps 36 of the first semiconductor chip 5 are electrically connected to the first wirings 31, 31*a* of the interposer 8, the bumps 37 of the second semiconductor chip 6 are electrically connected to the second wiring 32 of the interposer 8, and the bumps 38 of the third semiconductor chip 7 are electrically connected to the second wiring 33 of the interposer 38.

As above, the semiconductor device according to this embodiment is formed.

Modification Example

Hereinafter, there will be explained various modification examples of the semiconductor device according to the second embodiment.

Modification Example 1

FIG. 15 is a schematic cross-sectional view illustrating a configuration of a semiconductor device according to a modification example 1 of the second embodiment. Incidentally, the same reference numerals and symbols are added to the same composing members as those of the semiconductor device according to the second embodiment illustrated in FIG. 8, and their explanations are omitted.

Figure 16:
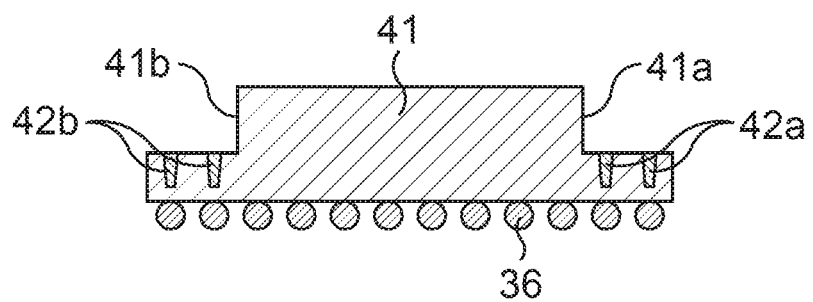
FIG. 16 is a schematic cross-sectional view illustrating a configuration of a first semiconductor chip of the semiconductor device according to the modification example 1 of the second embodiment.

In the modification example 1, similarly to the second embodiment, a first semiconductor chip 41, and the second and third semiconductor chips 6, 7 are connected on the interposer 8. In the first semiconductor chip 41, as illustrated in FIG. 16, a step is formed at each of one end portion and the other end portion on a rear surface thereof, namely, at each of the overlapping portions with the second and third semiconductor chips 6, 7 (to be referred to as step portions 41*a*, 41*b*). The thickness of each of the step portions 41*a*, 41*b* to a bottom surface portion is set to be substantially the same as that of the first semiconductor chip 5 according to the second embodiment. On the other hand, the portion other than the bottom surface portions of the step portions 41*a*, 41*b* of the first semiconductor chip 41 is formed to be thicker than the first semiconductor chip 5 according to the second embodiment. In the first semiconductor chip 41, through electrodes 42*a* being TSVs, for example, are formed in the bottom surface portion of the step portion 41*a*, and through electrodes 42*b* being TSVs, for example, are formed in the bottom surface portion of the step portion 41*b*.

The first, second, and third semiconductor chips 41, 6, and 7 are connected face down to the interposer 8. Concretely, the first semiconductor chip 41 is placed in the recessed portion 8*a* of the interposer 8, and the bumps 36 and the first wirings 31, 31*a* of the interposer 8 are electrically connected. The second semiconductor chip 6 is arranged on the front surface, of the interposer 8, around the recessed portion 8*a*, and the bumps 37 and the second wiring 32 of the interposer 8 are electrically connected. Further, one end portion of the second semiconductor chip 6 is fitted in the step portion 41*a* of the first semiconductor chip 41, and the bumps 37 of the second semiconductor chip 6 and the through electrodes 42*a* of the first semiconductor chip 41 are directly connected. The third semiconductor chip 7 is arranged on the front surface, of the interposer 8, around the recessed portion 8*a*, and the bumps 38 and the third wiring 33 of the interposer 8 are electrically connected. Further, the other end portion of the third semiconductor chip 7 is fitted in the step portion 41*b* of the first semiconductor chip 41, and the bumps 38 of the third semiconductor chip 7 and the through electrodes 42*b* of the first semiconductor chip 41 are directly connected.

The first semiconductor chip to be arranged in the recessed portion of the interposer includes the through electrodes in the portions connecting with the second and third semiconductor chips, to thus need to be formed in a manner to reduce the thickness of the portions. In the case of the thickness being thin, a warp becomes likely to occur in the first semiconductor chip. In the modification example 1, in order to improve this property of the first semiconductor chip, in the first semiconductor chip 41, only the step portions 41*a*, 41*b* being the portions where the through electrodes 42*a*, 42*b* are provided are worked to be thin, and the portion other than those is formed to be thicker than the bottom surface portions of the step portions 41*a*, 41*b*. Since in the first semiconductor chip 41, the through electrodes 42*a*, 42*b* are provided only in the overlapping portions with the second and third semiconductor chips 6, 7, the overlapping portions need to be thin. However, the portion other than those does not need to be thin. Therefore, the portion other than the step portions 41*a*, 41*b* is thickened, thereby making it possible to suppress occurrence of a warp, resulting in an improvement in yield. A part of the first semiconductor chip 41 is formed to be thick, and thereby a function of exhausting heat upward of the first semiconductor chip 41 also improves.

Modification Example 2

Figure 17:
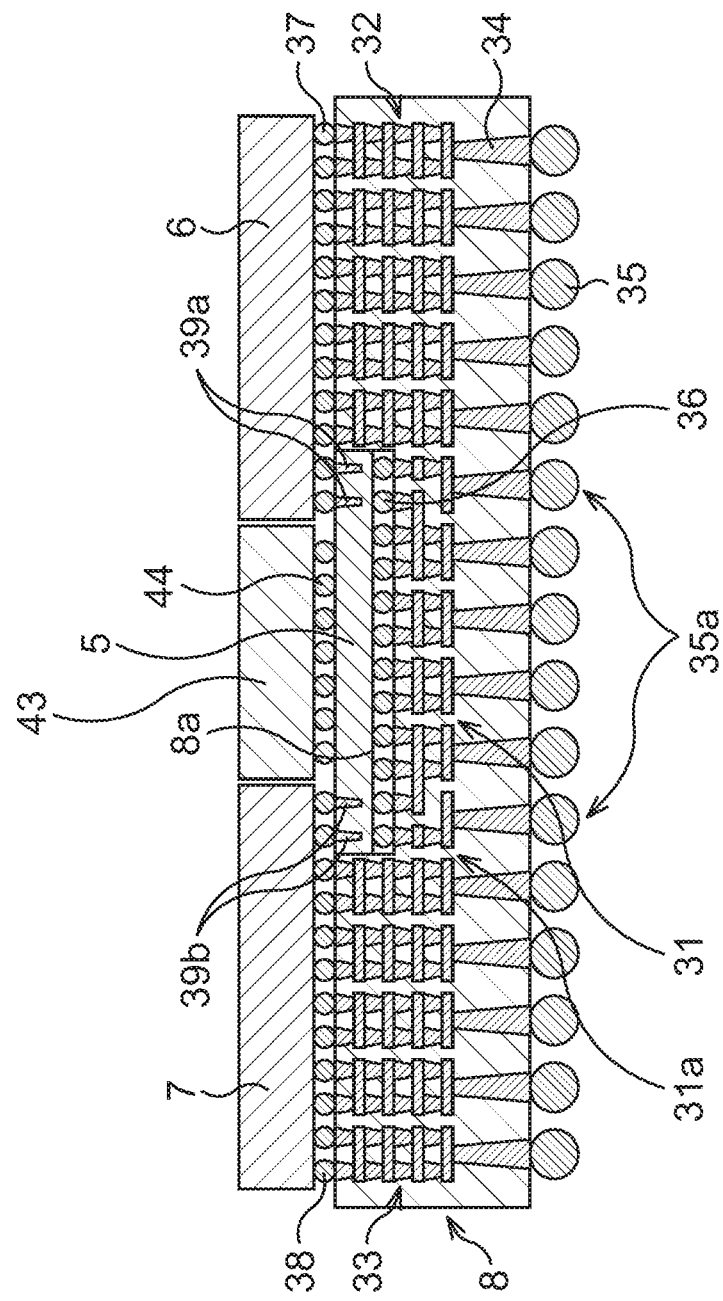
FIG. 17 is a schematic cross-sectional view illustrating a configuration of a semiconductor device according to a modification example 2 of the second embodiment.

FIG. 17 is a schematic cross-sectional view illustrating a configuration of a semiconductor device according to a modification example 2 of the second embodiment. Incidentally, the same reference numerals and symbols are added to the same composing members as those of the semiconductor device according to the second embodiment illustrated in FIG. 8, and their explanations are omitted.

Similarly to the second embodiment, the first, second, and third semiconductor chips 5, 6, and 7 are connected on the interposer 8. In the modification example 2, a dummy chip 43 is connected on the first semiconductor chip 5 by bumps 44 so as to fill a gap between the second semiconductor chip 6 and the third semiconductor chip 7. The dummy chip 43 does not have a complex internal structure, for example, and is formed of materials having high thermal conductivity, which are copper (Cu) and Si, for example. The dummy chip 43 is provided above the first semiconductor chip 5, and thereby the function of exhausting heat upward of the first semiconductor chip 5 improves. Incidentally, even in the semiconductor device according to the modification example 1, a dummy chip may be arranged above the first semiconductor chip 41 so as to fill a gap between the second semiconductor chip 6 and the third semiconductor chip 7 to achieve a further improvement in exhaust heat function.

Third Embodiment

In this embodiment, there will be disclosed a semiconductor device to which a technique of the 2.5-dimensional packaging and the three-dimensional packaging being combined is applied and a manufacturing method thereof.

(Semiconductor Device Configuration According to a Comparative Example)

Figure 18:
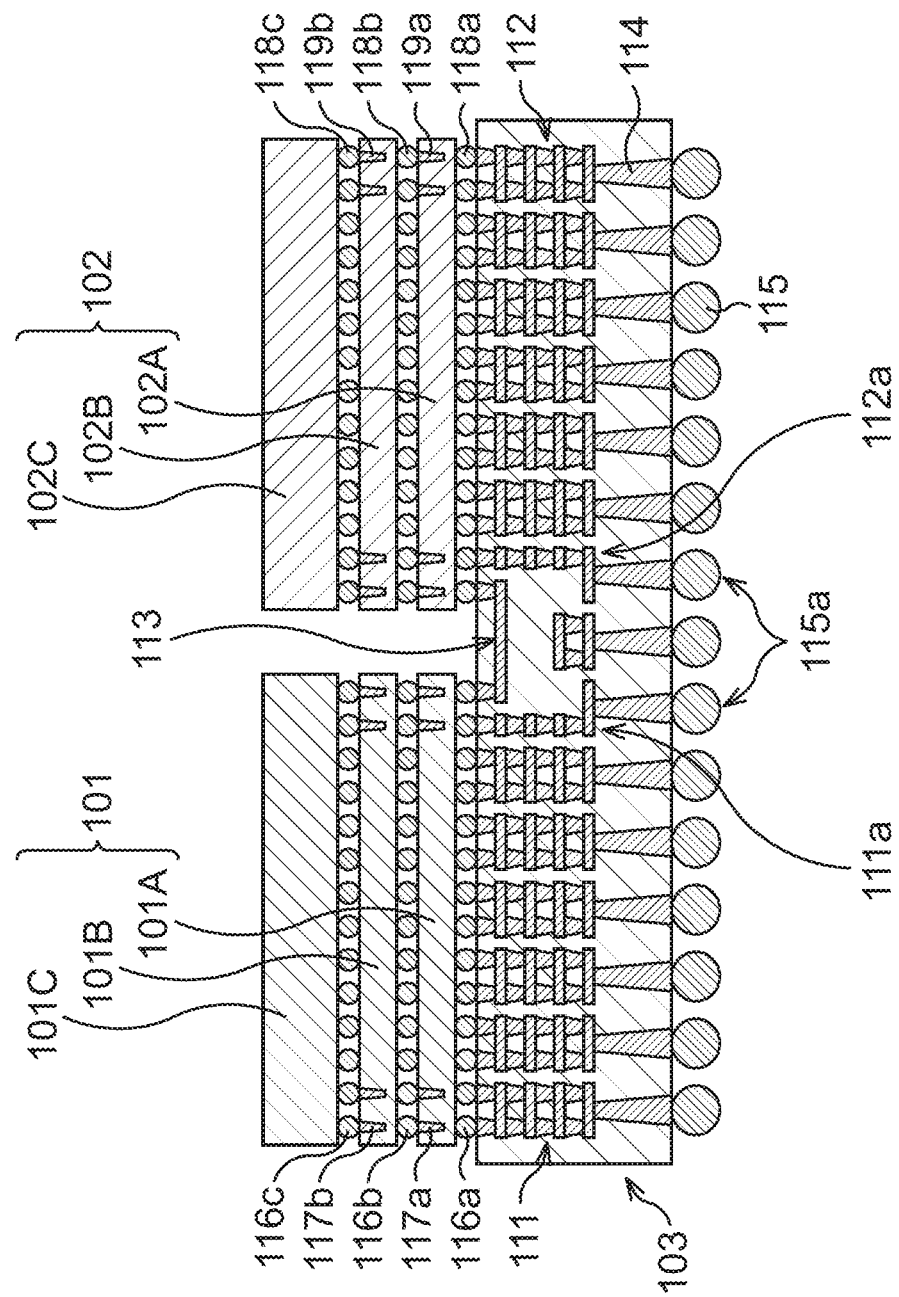
FIG. 18 is a schematic cross-sectional view illustrating a configuration of a semiconductor device according to a comparative example of a third embodiment.

FIG. 18 is a schematic cross-sectional view illustrating a configuration of a semiconductor device according to a comparative example of a third embodiment.

The configuration illustrated in FIG. 18, for example, is conceivable as the semiconductor device having the technique of the 2.5-dimensional packaging and the three-dimensional packaging being combined applied thereto.

In this semiconductor device, a plurality of semiconductor chip stacks, here, a first semiconductor chip stack 101 and a second semiconductor chip stack 102 are arranged in parallel on an interposer 103.

Inside the interposer 103, first wirings 111, 111a and second wirings 112, 112a, which are external signal connection or power supply wirings, and an inter-chip signal wiring 113 between a semiconductor chip 101A and a semiconductor chip 102A are provided. In the rear surface side of the interposer 103, there are provided a plurality of through electrodes 114 being TSVs, for example, that penetrate a semiconductor substrate between a rear surface and the first wirings 111, 111a or the second wirings 112, 112a and are each connected to the first wirings 111, 111a or the second wirings 112, 112a. On the rear surface of the interposer 103, bumps 115 being C4 bumps, for example, that are connected to the through electrodes 114 respectively are provided. In the example of the drawing, two bumps 115a become an external signal connection portion.

In the first semiconductor chip stack 101, for example, three layers of the semiconductor chip 101A and semiconductor chips 101B, 101C are stacked. On front surfaces (rear surfaces in FIG. 18) of the semiconductor chips 101A, 101B, and 101C, bumps 116a, 116b, and 116c being p bumps, for example, are provided respectively. Inside the semiconductor chips 101A, 101B, a plurality of through electrodes 117a, 117b being TSVs, for example, are provided respectively. The semiconductor chip 101A is connected to the first wirings 111, 111a and one end of the inter-chip signal wiring 113 of the interposer 103 by the bumps 116a. The semiconductor chip 101B is connected to the semiconductor chip 101A by the bumps 116b. Some of the bumps 116b are connected to the through electrodes 117a of the semiconductor chip 101A. The semiconductor chip 101C is connected to the semiconductor chip 101B by the bumps 116c. Some of the bumps 116c are connected to the through electrodes 117b of the semiconductor chip 101B. The semiconductor chip 101C does not include through electrodes, to thus be formed to be thicker than the semiconductor chips 101A, 101B. As for the through electrodes 117a, 117b, two types of a through electrode for power supply and a through electrode for signal transmission exist.

In the first semiconductor chip stack 102, for example, three layers of the semiconductor chip 102A and semiconductor chips 102B, 102C are stacked. On front surfaces (rear surfaces in FIG. 18) of the semiconductor chips 102A, 102B, and 102C, bumps 118a, 118b, and 118c being p bumps, for example, are provided respectively. Inside the semiconductor chips 102A, 102B, a plurality of through electrodes 119a, 119b being TSVs, for example, are provided respectively. The semiconductor chip 102A is connected to the second wirings 112, 112a and the other end of the inter-chip signal wiring 113 of the interposer 103 by the bumps 118a. The semiconductor chip 102B is connected to the semiconductor chip 102A by the bumps 118b. Some of the bumps 118b are connected to the through electrodes 119a of the semiconductor chip 102A. The semiconductor chip 102C is connected to the semiconductor chip 102B by the bumps 118c. Some of the bumps 118c are connected to the through electrodes 119b of the semiconductor chip 102B. The semiconductor chip 102C does not include through electrodes, to thus be formed to be thicker than the semiconductor chips 102A, 102B. As for the through electrodes 119a, 119b, two types of a through electrode for power supply and a through electrode for signal transmission exist.

In the semiconductor device according to the comparative example, the first semiconductor chip stack 101 and the second semiconductor chip stack 102 are electrically connected by the inter-chip signal wiring 113. In this configuration, a signal transmission path between the both stacks, particularly, between the upper semiconductor chips becomes long. For example, there is considered a case where signal communication is performed between the semiconductor chip 101C being the uppermost layer of the first semiconductor chip stack 101 and the semiconductor chip 102C being the uppermost layer of the second semiconductor chip stack 102. In this case, a signal has to go through a long signal transmission path of the semiconductor chip 101C→the semiconductor chip 101B→the semiconductor chip 101A→the inter-chip signal wiring 113→the semiconductor chip 102A→the semiconductor chip 102B→the semiconductor chip 102C, and thus the latency increases.

(Semiconductor Device Configuration According to this Embodiment)

Figure 19:
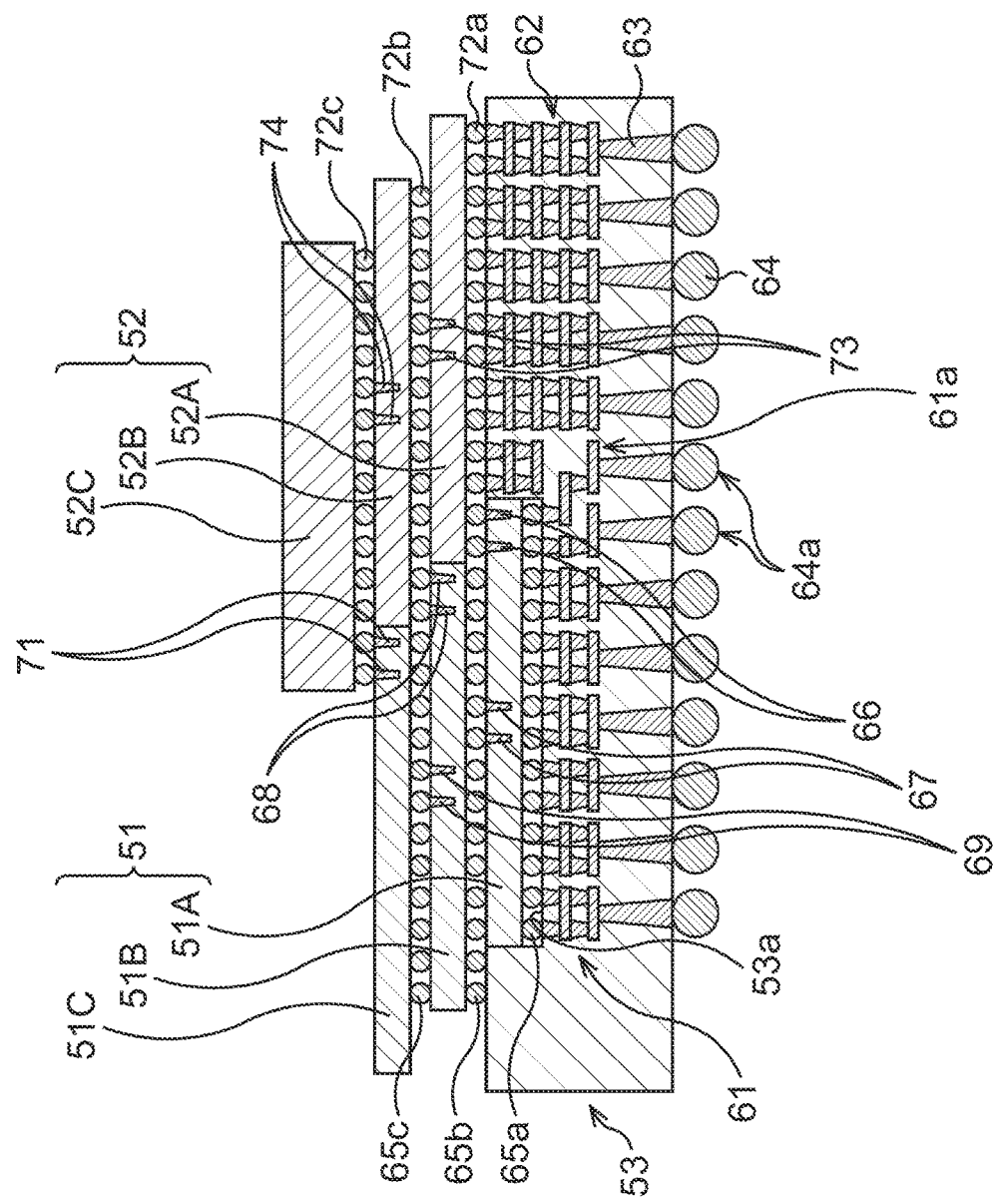
FIG. 19 is a schematic cross-sectional view illustrating a configuration of a semiconductor device according to the third embodiment.

FIG. 19 is a schematic cross-sectional view illustrating a configuration of the semiconductor device according to the third embodiment.

In this semiconductor device, a plurality of semiconductor chip stacks, here, a first semiconductor chip stack 51 and a second semiconductor chip stack 52 are arranged in parallel on an interposer 53.

The interposer 53 has a recessed portion 53a formed in a front surface thereof, and has a signal wiring and a power supply wiring that are connected to the outside provided therein. For example, first wirings 61, 61a are provided under a bottom surface of the recessed portion 53a, and a second wiring 62 is provided under the front surface around the recessed portion 53a. The first wirings 61, 61a and the second wiring 62 have a wiring portion and a via portion connected to the wiring portion. In the rear surface side of the interposer 53, there are provided a plurality of through electrodes 63 being TSVs, for example, that penetrate a semiconductor substrate between a rear surface and the first wirings 61, 61a, or the second wiring 62 and are each connected to the first wirings 61, 61a, or the second wiring 62. On the rear surface of the interposer 53, bumps 64 being C4 bumps, for example, that are connected to the through electrodes 63 respectively are provided. In the example of the drawing, two bumps 64a become an external signal connection portion.

The first semiconductor chip stack 51 is made by, for example, three layers of semiconductor chips 51A, 51B, and 51C being stacked. The semiconductor chips 51A, 51B, and 51C each have various functional elements such as MOS transistors, their wirings, and so on, for example, provided therein, and have bumps 65a, 65b, and 65c being p bumps, for example, provided on front surfaces thereof (rear surfaces thereof in FIG. 19) respectively. Inside the semiconductor chip 51A, a plurality of through electrodes 66, 67 being TSVs, for example, are provided. Inside the semiconductor chip 51B, a plurality of through electrodes 68, 69 being TSVs, for example, are provided. Inside the semiconductor chip 51C, a plurality of through electrodes 71 being TSVs, for example, are provided. The through electrodes 66, 67, 68, 69, and 71 are the example for signal transmission. Other than those, through electrodes for power supply (not illustrated) also exist.

The semiconductor chip 51A is fitted in the recessed portion 53a of the interposer 53, and the bumps 65a and the first wirings 61, 61a of the interposer 53 are electrically connected. The semiconductor chip 51B is arranged on the semiconductor chip 51A in a manner to move to the left in the drawing relative to the semiconductor chip 51A, and is connected to the through electrodes 67 of the semiconductor chip 51A via the bumps 65b. The semiconductor chip 51C is arranged on the semiconductor chip 51B in a manner to move to the left in the drawing relative to the semiconductor chip 51B, and is connected to the through electrodes 69 of the semiconductor chip 51B via the bumps 65c.

The second semiconductor chip stack 52 is made by, for example, three layers of semiconductor chips 52A, 52B, and 52C being stacked. The semiconductor chips 52A, 52B, and 52C each have various functional elements such as MOS transistors, their wirings, and so on, for example, provided therein, and have bumps 72a, 72b, and 72c being p bumps, for example, provided on front surfaces thereof (rear surfaces thereof in FIG. 19) respectively. Inside the semiconductor chip 52A, a plurality of through electrodes 73 being TSVs, for example, are provided. Inside the semiconductor chip 53B, a plurality of through electrodes 74 being TSVs, for example, are provided. The semiconductor chip 52C does not include through electrodes, to thus be formed to be thicker than the semiconductor chips 52A, 52B. The through electrodes 73, 74 are the example for signal transmission. Other than those, through electrodes for power supply (not illustrated) also exist.

The semiconductor chip 52A is arranged on the front surface, of the interposer 53, around the recessed portion 53a adjacently to the semiconductor chip 51B of the first semiconductor chip stack 51, and the bumps 72a and the second wiring 62 of the interposer 53 are electrically connected. Further, the semiconductor chip 52A is stacked in a manner to partially overlap the semiconductor chip 51A of the first semiconductor chip stack 51 in a plan view, and at the overlapping portion, the bumps 72a of the semiconductor chip 52A and the through electrodes 66 of the semiconductor chip 51A are directly connected. The semiconductor chip 52B is arranged on the semiconductor chip 52A adjacently to the semiconductor chip 51C of the first semiconductor chip stack 51, and the bumps 72b and the through electrodes 73 of the semiconductor chip 52A are electrically connected. Further, the semiconductor chip 52B is stacked in a manner to partially overlap the semiconductor chip 51B of the first semiconductor chip stack 51 in a plan view, and at the overlapping portion, the bumps 72b of the semiconductor chip 52B and the through electrodes 68 of the semiconductor chip 51B are directly connected. The semiconductor chip 52C is arranged on the semiconductor chip 52B, and the bumps 72c and the through electrodes 74 of the semiconductor chip 52B are electrically connected. Further, the semiconductor chip 52C is stacked in a manner to partially overlap the semiconductor chip 51C of the first semiconductor chip stack 51 in a plan view, and at the overlapping portion, the bumps 72c of the semiconductor chip 52C and the through electrodes 71 of the semiconductor chip 51C are directly connected.

In the semiconductor device according to this embodiment, between the first semiconductor chip stack 51 and the second semiconductor chip stack 52, the semiconductor chips composing the both are directly electrically connected by the through electrodes without using the inter-chip signal wiring to connect the both in the interposer 53. With this configuration, the signal transmission path between the both stacks becomes short very much. For example, there is considered a case where signal communication is performed between the semiconductor chip 51C being the uppermost layer of the first semiconductor chip stack 51 and the semiconductor chip 52C being the uppermost layer of the second semiconductor chip stack 52. The semiconductor chip 51C and the semiconductor chip 52C are directly connected by the through electrodes 71 at the overlapping portion of them, and the signal transmission path is shortened drastically as compared to the semiconductor device according to the comparative example. Thereby, the latency between the semiconductor chips is reduced and high device performance is achieved.

Incidentally, the semiconductor device according to this embodiment is also mounted on a package bonded onto a substrate to make a stacked semiconductor structure, similarly to the semiconductor device according to the first embodiment.

(Manufacturing Method of the Semiconductor Device)

Next, there will be explained manufacturing methods of the semiconductor device according to this embodiment.

—Manufacturing Method 1—

FIG. 20A to FIG. 20C and FIG. 21A and FIG. 21B are schematic cross-sectional views illustrating a manufacturing method 1 of the semiconductor device according to the third embodiment in order of processes.

Figure 20A:
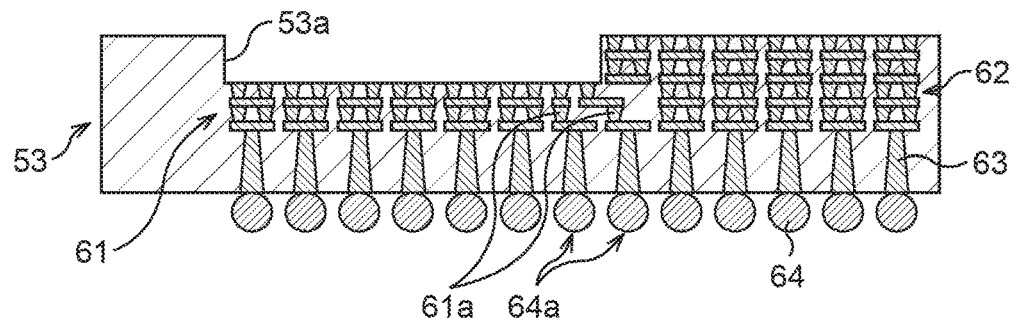
FIG. 20A to FIG. 20C are schematic cross-sectional views illustrating a manufacturing method 1 of the semiconductor device according to the third embodiment in order of processes.

First, as illustrated in FIG. 20A, the interposer 53 is prepared. The interposer 53 has the recessed portion 53a formed in the front surface thereof, and has, as the power supply wiring, the first wiring 61 and the second wiring 62 and, as the signal wiring, the first wiring 61a provided therein.

Figure 20B:
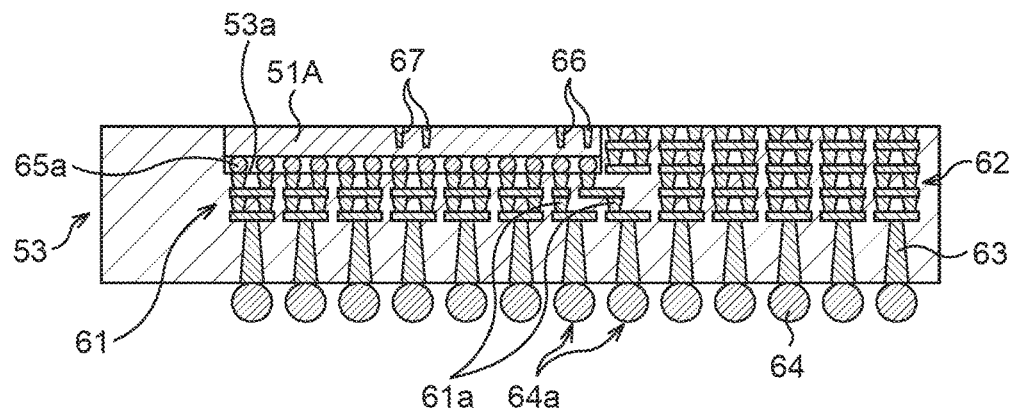

Subsequently, as illustrated in FIG. 20B, the semiconductor chip 51A of the first semiconductor chip stack 51 is connected face down to the interposer 53.

More specifically, the semiconductor chip 51A is fitted in the recessed portion 53a of the interposer 53 with its chip top surface flipped down, and the bumps 65a of the semiconductor chip 51A are electrically connected to the first wirings 61, 61a of the interposer 53.

Figure 20C:
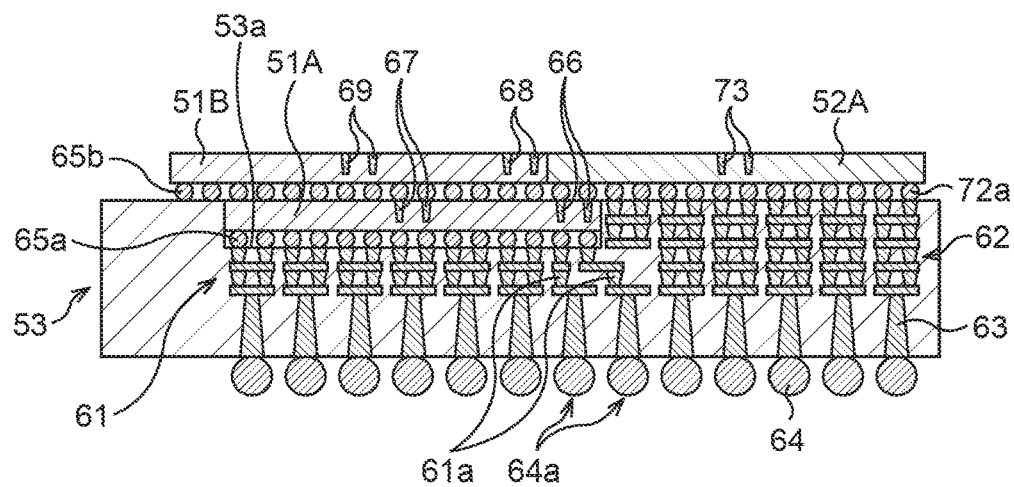

Subsequently, as illustrated in FIG. 20C, the semiconductor chip 51B and the semiconductor chip 52A are connected face down.

More specifically, the semiconductor chip 51B is provided on the semiconductor chip 51A in a manner to move to the left in the drawing, and the bumps 65b of the semiconductor chip 51B and the through electrodes 67 of the semiconductor chip 51A are connected. The semiconductor chip 52A is provided on the front surface, of the interposer 53, around the recessed portion 53a so as to be adjacent to the semiconductor chip 51B, and at the same time, is stacked on the semiconductor chip 51A at the overlapping portion. Then, the bumps 72a of the semiconductor chip 52A are electrically connected to the second wiring 62 of the interposer 53, and the bumps 72a of the semiconductor chip 52A and the through electrodes 66 of the semiconductor chip 51A are electrically connected. The through electrodes for power supply (not illustrated) are also connected similarly.

Figure 21A:
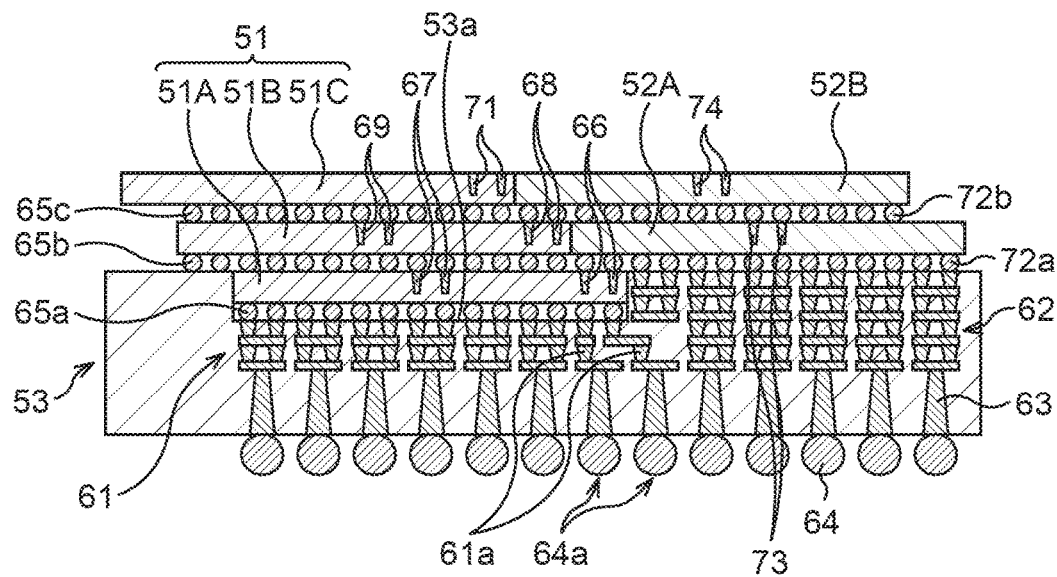
FIG. 21A and FIG. 21B are schematic cross-sectional views illustrating, subsequently to FIG. 20A to FIG. 20C, the manufacturing method 1 of the semiconductor device according to the third embodiment in order of processes.

Subsequently, as illustrated in FIG. 21A, the semiconductor chip 51C and the semiconductor chip 52B are connected face down.

More specifically, the semiconductor chip 51C is provided on the semiconductor chip 51B in a manner to move to the left in the drawing, and the bumps 65c of the semiconductor chip 51C and the through electrodes 69 of the semiconductor chip 51B are connected. The semiconductor chip 52B is provided on the semiconductor chip 52A in a manner to move to the left in the drawing so as to be adjacent to the semiconductor chip 51C, and at the same time, is stacked on the semiconductor chip 51B at the overlapping portion. Then, the bumps 72b of the semiconductor chip 52B are electrically connected to the through electrodes 73 of the semiconductor chip 52A, and the bumps 72b of the semiconductor chip 52B are electrically connected to the through electrodes 68 of the semiconductor chip 51B. The through electrodes for power supply (not illustrated) are also connected similarly.

Figure 21B:
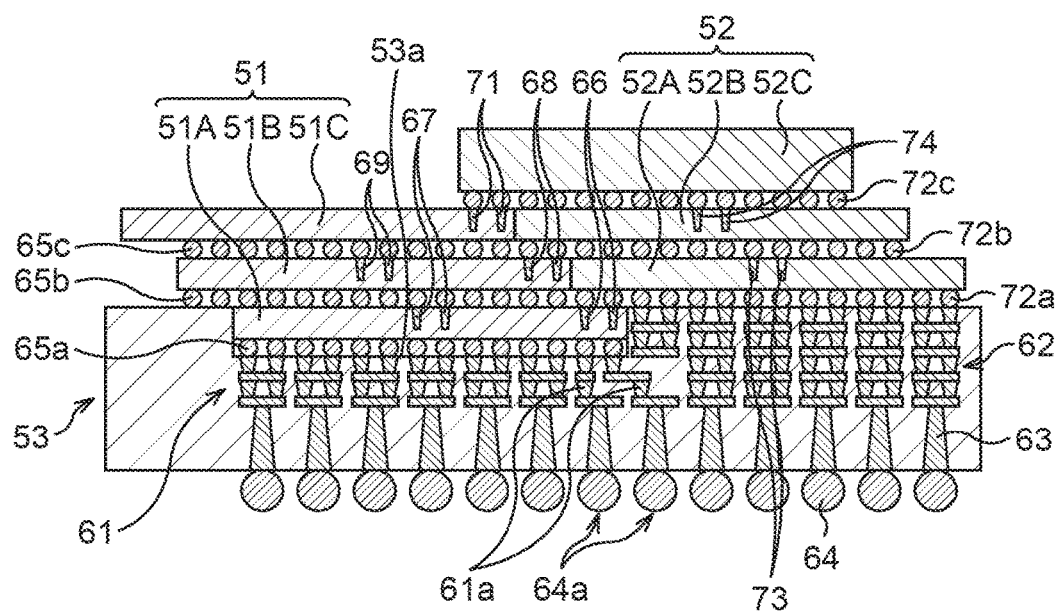

Subsequently, as illustrated in FIG. 21B, the semiconductor chip 52C is connected face down.

More specifically, the semiconductor chip 52C is provided on the semiconductor chip 52B in a manner to move to the left in the drawing, and at the same time, is stacked on the semiconductor chip 51C at the overlapping portion. Then, the bumps 72c of the semiconductor chip 52C are electrically connected to the through electrodes 74 of the semiconductor chip 52B, and the bumps 72c of the semiconductor chip 52C are electrically connected to the through electrodes 71 of the semiconductor chip 51C. The through electrodes for power supply (not illustrated) are also connected similarly.

As above, there is formed the semiconductor device according to this embodiment in which the first semiconductor chip stack 51 and the second semiconductor chip stack 52 are arranged in parallel on the interposer 53.

—Manufacturing Method 2—

Figure 22A:
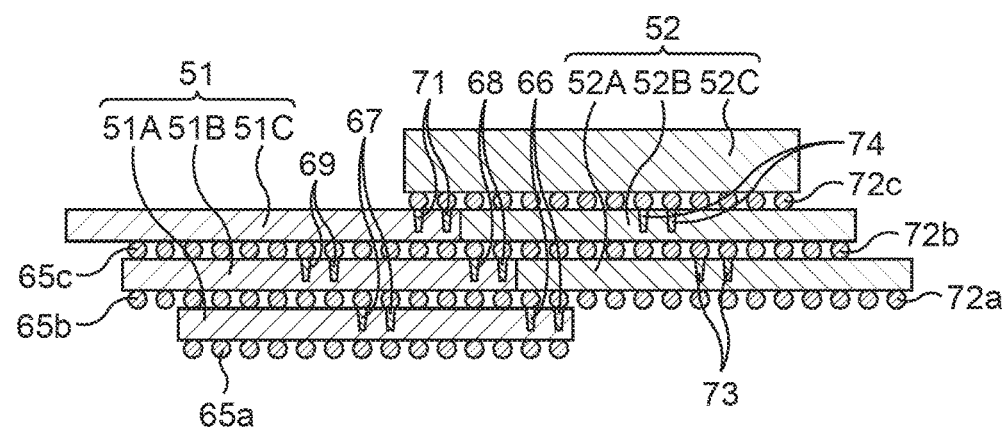
FIG. 22A and FIG. 22B are schematic cross-sectional views illustrating a manufacturing method 2 of the semiconductor device according to the third embodiment in order of processes.
Figure 22B:
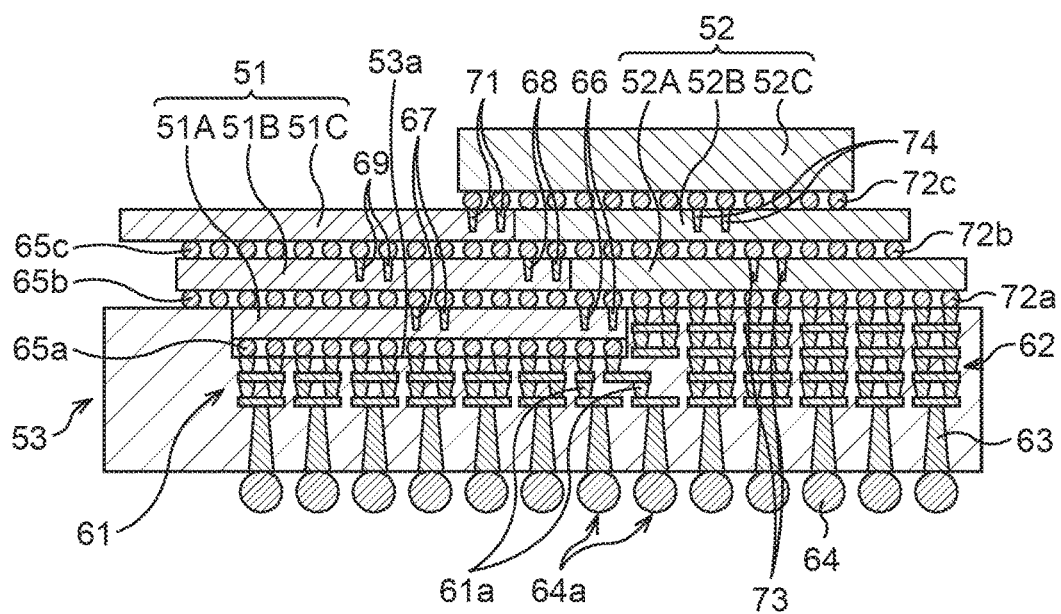

FIG. 22A and FIG. 22B are schematic cross-sectional views illustrating a manufacturing method 2 of the semiconductor device according to the third embodiment in order of processes.

First, similarly to the manufacturing method 1, the interposer 53 is prepared.

Subsequently, as illustrated in FIG. 22A, the first semiconductor chip stack 51 and the second semiconductor chip stack 52 are connected.

More specifically, first, the semiconductor chip 52B is stacked on the semiconductor chip 52C as a base. Then, the bumps 72c of the semiconductor chip 52C and the through electrodes 74 of the semiconductor chip 52B are electrically connected. To the left of the semiconductor chip 52C in the drawing, a structure having a height substantially the same as the sum of the height of the semiconductor chip 52C and the height of the bumps 72c is arranged. The semiconductor chip 51C is arranged to the left of the semiconductor chip 52B in the drawing so as to be adjacent to the semiconductor chip 52B, and at the same time, the overlapping portion of the semiconductor chip 51C and the semiconductor chip 52C are stacked in an overlapping manner. Then, the bumps 72c of the semiconductor chip 52C and the through electrodes 71 of the semiconductor chip 51C are electrically connected. The through electrodes for power supply (not illustrated) are also connected similarly.

Next, the semiconductor chip 52A is stacked on the semiconductor chip 52B. Then, the bumps 72b of the semiconductor chip 52B and the through electrodes 73 of the semiconductor chip 52A are electrically connected. The semiconductor chip 51B is arranged to the left of the semiconductor chip 52A in the drawing so as to be adjacent to the semiconductor chip 52A, and at the same time, the semiconductor chip 51B, the semiconductor chip 51A, and a left part of the semiconductor chip 52B in the drawing are stacked in an overlapping manner. Then, the bumps 65c of the semiconductor chip 51C and the through electrodes 69 of the semiconductor chip 51B are electrically connected, and at the same time, the bumps 72b of the semiconductor chip 52B and the through electrodes 68 of the semiconductor chip 51B are electrically connected. The through electrodes for power supply (not illustrated) are also connected similarly.

Next, the semiconductor chip 51A is stacked on the semiconductor chip 51B and a left part of the semiconductor chip 52A in the drawing. Then, the bumps 65b of the semiconductor chip 51B are electrically connected to the through electrodes 67 of the semiconductor chip 51A, and at the same time, the bumps 72a of the semiconductor chip 52A are electrically connected to the through electrodes 66 of the semiconductor chip 51A. The through electrodes for power supply (not illustrated) are also connected similarly.

As above, it is possible to obtain the first semiconductor chip stack 51 and the second semiconductor chip stack 52 that are connected.

Subsequently, as illustrated in FIG. 22B, the connected first semiconductor chip stack 51 and second semiconductor chip stack 52 is connected face down to the interposer 53.

More specifically, the semiconductor chip 51A of the first semiconductor chip stack 51 is fitted in the recessed portion 53a of the interposer 53 with the chip top surface flipped down, and at the same time, the semiconductor chip 52A of the second semiconductor chip stack 52 is provided on the front surface, of the interposer 53, around the recessed portion 53a. Then, the bumps 65a of the semiconductor chip 51A are electrically connected to the first wirings 61, 61a of the interposer 53, and the bumps 72a of the semiconductor chip 52A are electrically connected to the second wiring 62 of the interposer 53.

As above, the semiconductor device according to this embodiment is formed.

Modification Example

Hereinafter, there will be explained a modification example of the semiconductor device according to the third embodiment.

Figure 23:
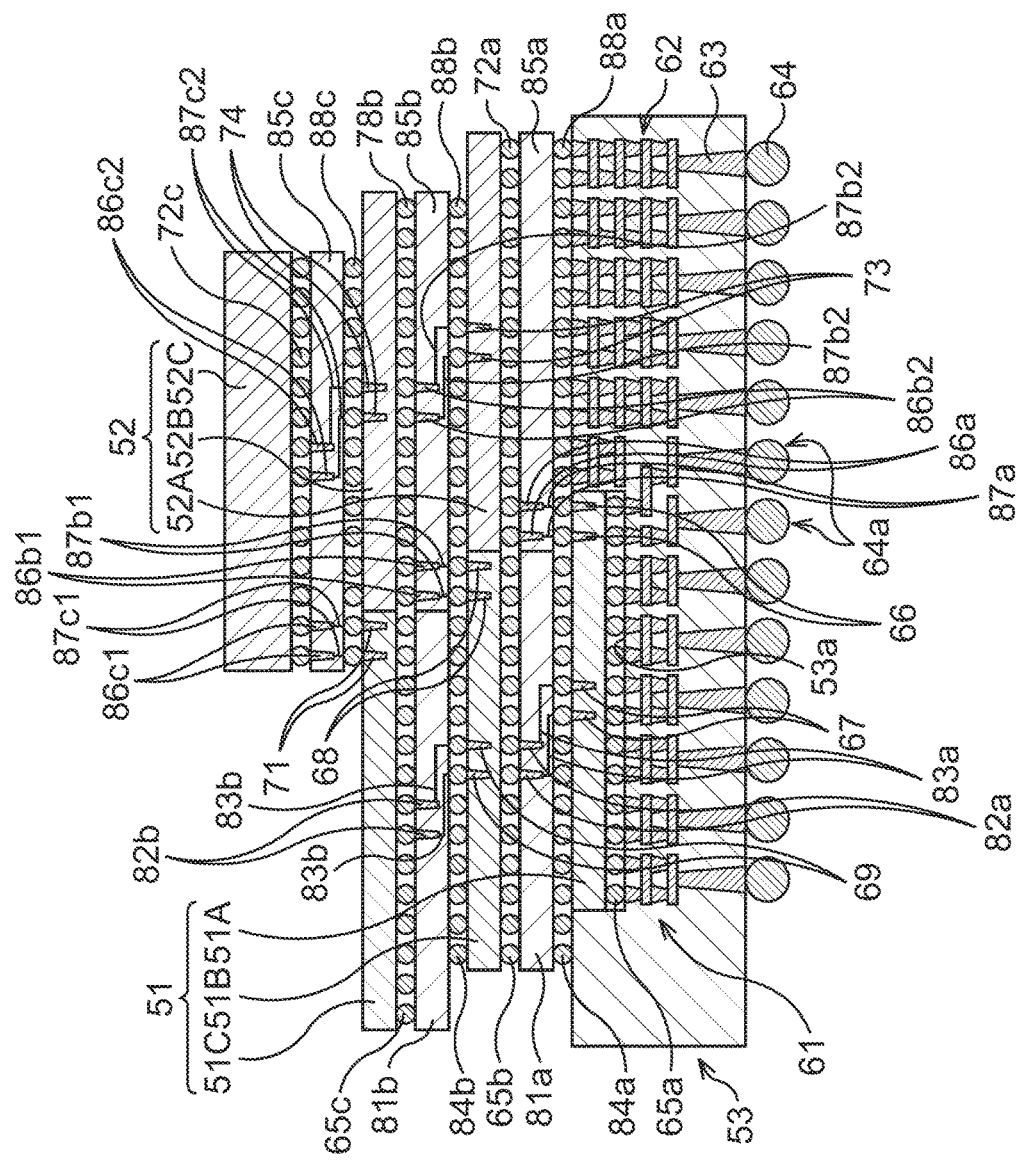
FIG. 23 is a schematic cross-sectional view illustrating a configuration of a semiconductor device according to a modification example of the third embodiment.

FIG. 23 is a schematic cross-sectional view illustrating a configuration of a semiconductor device according to the modification example of the third embodiment. Incidentally, the same reference numerals and symbols are added to the same composing members as those of the semiconductor device according to the third embodiment illustrated in FIG. 19, and their explanations are omitted.

In this modification example, inter-chip interposers are each arranged between semiconductor chips of each of the first semiconductor chip stack 51 and the second semiconductor chip stack 52.

Concretely, a first inter-chip interposer 81a has a plurality of through electrodes 82a being TSVs, for example, and a wiring 83a that is connected to the through electrodes 82a provided therein, and has bumps 84a being p bumps, for example, provided on a rear surface thereof. The first inter-chip interposer 81a is arranged between the semiconductor chip 51A and the semiconductor chip 51B, and the wiring 83a is connected to the bumps 84a connected to the through electrodes 67 of the semiconductor chip 51A. By this configuration, the semiconductor chip 51A and the semiconductor chip 51B are electrically connected via the through electrodes 82a and the wiring 83a of the first inter-chip interposer 81a. The through electrodes 67, 82a are the example for signal transmission. Other than those, through electrodes for power supply (not illustrated) also exist.

A first inter-chip interposer 81b has a plurality of through electrodes 82b being TSVs, for example, and a wiring 83b that is connected to the through electrodes 82a provided therein, and has bumps 84b being p bumps, for example, provided on a rear surface thereof. The first inter-chip interposer 81b is arranged between the semiconductor chip 51B and the semiconductor chip 51C, and the wiring 83b is connected to the bumps 84b connected to the through electrodes 69 of the semiconductor chip 51B. By this configuration, the semiconductor chip 51B and the semiconductor chip 51C are electrically connected via the through electrodes 82b and the wiring 83b of the first inter-chip interposer 81b. The through electrodes 69, 82b are the example for signal transmission. Other than those, through electrodes for power supply (not illustrated) also exist.

A second inter-chip interposer 85a has a plurality of through electrodes 86a being TSVs, for example, and a wiring 87a that is connected to the through electrodes 86a provided therein, and has bumps 88a being p bumps, for example, provided on a rear surface thereof. The second inter-chip interposer 85a is arranged between the interposer 53 and the semiconductor chip 51A, the semiconductor chip 52A, and the wiring 87a is connected to the bumps 88a connected to the through electrodes 66 of the semiconductor chip 51A. By this configuration, the semiconductor chip 51A and the semiconductor chip 52A are electrically connected via the through electrodes 86a and the wiring 87a of the first inter-chip interposer 85a. The through electrodes 66, 86a are the example for signal transmission. Other than those, through electrodes for power supply (not illustrated) also exist.

A second inter-chip interposer 85b has a plurality of through electrodes 86b1, 86b2 being TSVs, for example, and wirings 87b1, 87b2 that are connected to the through electrodes 86b1, 86b2 provided therein, and has bumps 88b being p bumps, for example, provided on a rear surface thereof. The second inter-chip interposer 85b is arranged between the semiconductor chip 51B, the semiconductor chip 52A and the semiconductor chip 52B. The wiring 87b1 is connected to the bumps 88b connected to the through electrodes 68 of the semiconductor chip 51B. The wiring 87b2 is connected to the bumps 88b connected to the through electrodes 73 of the semiconductor chip 52A. By this configuration, the semiconductor chip 51B, the semiconductor chip 52A, and the semiconductor chip 52B are electrically connected via the through electrodes 86b1, 86b2 and the wirings 87b1, 87b2 of the second inter-chip interposer 85b. The through electrodes 68, 73, 86b1, and 86b2 are the example for signal transmission. Other than those, through electrodes for power supply (not illustrated) also exist.

A second inter-chip interposer 85c has a plurality of through electrodes 86c1, 86c2 being TSVs, for example, and wirings 87c1, 87c2 that are connected to the through electrodes 86c1, 86c2 provided therein, and has bumps 88c being p bumps, for example, provided on a rear surface thereof. The second inter-chip interposer 85c is arranged between the semiconductor chip 51C, the semiconductor chip 52B and the semiconductor chip 52C. The wiring 87c1 is connected to the bumps 88c connected to the through electrodes 71 of the semiconductor chip 51C. The wiring 87c2 is connected to the bumps 88c connected to the through electrodes 74 of the semiconductor chip 52B. By this configuration, the semiconductor chip 51C, the semiconductor chip 52B, and the semiconductor chip 52C are electrically connected via the through electrodes 86c1, 86c2 and the wirings 87c1, 87c2 of the second inter-chip interposer 85c. The through electrodes 71, 74, 86c1, and 86c2 are the example for signal transmission. Other than those, through electrodes for power supply (not illustrated) also exist.

In the semiconductor device according to this modification example, the first inter-chip interposers 81a, 81b and the second inter-chip interposers 85a to 85c are provided, thereby making it possible to impart a high degree of freedom to signal connections between the upper and lower and right and left semiconductor chips in the first and second semiconductor chip stacks 51, 52.

In one aspect, it is possible to obtain a semiconductor device that achieves high device performance by reducing the latency between semiconductor chips.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A semiconductor device, comprising:
 a connection structure that has a recessed portion formed in an upper surface thereof;
 a first semiconductor chip that comprises through electrodes in one end portion of a rear surface thereof, the through electrodes penetrating a semiconductor substrate, and is fitted in the recessed portion with a chip top surface thereof flipped down to be connected to the connection structure; and
 a second semiconductor chip located above the first semiconductor chip and having bumps that is connected on the one end portion of the first semiconductor chip and on the connection structure, and is electrically connected to the first semiconductor chip via the through electrodes with the bumps being in contact and connected to the through electrode,
 the first semiconductor chip has a step formed at the one end portion.
2. The semiconductor device according to claim 1, wherein the connection structure further comprises a first connection structure and a second connection structure that has an opening portion formed therein, and the second connection structure is electrically connected on the first connection structure, and the opening portion is the recessed portion.

3. The semiconductor device according to claim 1, wherein the connection structure further comprises a first wiring that is provided under a bottom surface of the recessed portion and comprises a second wiring that is provided under the front surface around the recessed portion, the first semiconductor chip is fitted in the recessed portion of the connection structure to be electrically connected to the first wiring, and the second semiconductor chip is electrically connected to the second wiring on the front surface, of the connection structure, around the recessed portion.

4. The semiconductor device according to claim 1, further comprising:

another first semiconductor chip that is arranged on the first semiconductor chip in parallel with the second semiconductor chip and is electrically connected to the first semiconductor chip; and another second semiconductor chip that is stacked on the second semiconductor chip in a manner to partially overlap the another first semiconductor chip and is electrically connected to the second semiconductor chip and the another first semiconductor chip.

5. The semiconductor device according to claim 4, further comprising:

a first inter-chip interposer that is arranged between the first semiconductor chip and the another first semiconductor chip and comprises, therein, a first signal wiring that electrically connects the first semiconductor chip and the another first semiconductor chip;

a second inter-chip interposer that is arranged in parallel with the first inter-chip interposer between the connection structure, the first semiconductor chip and the second semiconductor chip and comprises, therein, a second signal wiring that electrically connects the first semiconductor chip and the second semiconductor chip; and a third inter-chip interposer that is arranged between the another first semiconductor chip, the second semiconductor chip and the another second semiconductor chip, and comprises: therein, a third signal wiring that electrically connects the another first semiconductor chip and the another second semiconductor chip; and a fourth signal wiring that electrically connects the second semiconductor chip and the another second semiconductor chip.

6. The semiconductor device according to claim 1, wherein the first semiconductor chip comprises other through electrodes in the other end portion of the rear surface, the other through electrodes penetrating the semiconductor substrate, the semiconductor device further comprising:

a third semiconductor chip that is connected on the other end portion of the first semiconductor chip and on the connection structure and is electrically connected to the first semiconductor chip via the other through electrodes in the other end portion.

7. The semiconductor device according to claim 6, wherein the connection structure further comprises a third wiring under the front surface around the recessed portion, and the third semiconductor chip is electrically connected to the third wiring on the front surface, of the connection structure, around the recessed portion.

8. The semiconductor device according to claim 6, wherein the first semiconductor chip has a step formed at the other end portion.

9. The semiconductor device according to claim 6, further comprising:

a dummy chip that is arranged above the first semiconductor chip to fill a gap between the second semiconductor chip and the third semiconductor chip.

10. A manufacturing method of a semiconductor device that comprises: a connection structure that has a recessed portion formed in an upper surface thereof; a first semiconductor chip that comprises through electrodes in one end portion of a rear surface thereof, the through electrodes penetrating a semiconductor substrate; and a second semiconductor chip having bumps, the manufacturing method comprising:

fitting the first semiconductor chip in the recessed portion with a chip top surface thereof flipped down and connecting the first semiconductor chip to the connection structure, and connecting the second semiconductor chip on the one end portion of the first semiconductor chip and on the connection structure so as to locate the second semiconductor chip above the first semiconductor chip; and by contacting and connecting the through electrodes and the bumps with each other, electrically connecting the first semiconductor chip and the second semiconductor chip via the through electrodes, the first semiconductor chip has a step formed at the one end portion.

11. The manufacturing method of the semiconductor device according to claim 10, wherein the connection structure further comprises a first connection structure and a second connection structure that has an opening portion formed therein, and the second connection structure is electrically connected on the first connection structure, and the opening portion is the recessed portion.

12. The manufacturing method of the semiconductor device according to claim 10, wherein the connection structure further comprises a first wiring that is provided under a bottom surface of the recessed portion and comprises a second wiring that is provided under the front surface around the recessed portion, the first semiconductor chip is fitted in the recessed portion of the connection structure to be electrically connected to the first wiring; and the second semiconductor chip is electrically connected to the second wiring on the front surface, of the connection structure, around the recessed portion.

13. The manufacturing method of the semiconductor device according to claim 10, further comprising:

electrically connecting another first semiconductor chip to the first semiconductor chip on the first semiconductor chip to be parallel with the second semiconductor chip; and stacking another second semiconductor chip on the second semiconductor chip in a manner to partially overlap the another first semiconductor chip and electrically connecting the another second semiconductor chip to the second semiconductor chip and the another first semiconductor chip.

14. The manufacturing method of the semiconductor device according to claim 13, further comprising:
   providing a first inter-chip interposer that comprises, therein, a first signal wiring between the first semiconductor chip and the another first semiconductor chip and electrically connecting the first semiconductor chip and the another first semiconductor chip via the first signal wiring;
   providing a second inter-chip interposer that comprises, therein, a second signal wiring between the connection structure, the first semiconductor chip and the second semiconductor chip to be parallel with the first inter-chip interposer, and electrically connecting the first semiconductor chip and the second semiconductor chip via the second signal wiring; and
   providing a third inter-chip interposer that comprises, therein, a third signal wiring and a fourth signal wiring between the another first semiconductor chip, the second semiconductor chip and the another second semiconductor chip, electrically connecting the another first semiconductor chip and the another second semiconductor chip via the third signal wiring, and electrically connecting the second semiconductor chip and the another second semiconductor chip via the fourth signal wiring.

15. The manufacturing method of the semiconductor device according to claim 10, wherein
   the first semiconductor chip comprises other through electrodes in the other end portion of the rear surface, the other through electrodes penetrating the semiconductor substrate, the manufacturing method further comprising:
   connecting a third semiconductor chip on the other end portion of the first semiconductor chip and on the connection structure and electrically connecting the third semiconductor chip to the first semiconductor chip via the other through electrodes.

16. The manufacturing method of the semiconductor device according to claim 15, wherein
   the connection structure further comprises a third wiring under the front surface around the recessed portion, the manufacturing method further comprising:
   electrically connecting the third semiconductor chip to the third wiring.

17. The manufacturing method of the semiconductor device according to claim 15, wherein the first semiconductor chip has a step formed at the other end portion.

18. The manufacturing method of the semiconductor device according to claim 15, further comprising:
   providing a dummy chip above the first semiconductor chip to fill a gap between the second semiconductor chip and the third semiconductor chip.

* * * * *